US010749517B2

(12) United States Patent
Nakajima et al.

(10) Patent No.: US 10,749,517 B2
(45) Date of Patent: Aug. 18, 2020

(54) SEMICONDUCTOR DEVICE AND OVERCURRENT PROTECTION DEVICE

(71) Applicant: Renesas Electronics Corporation, Tokyo (JP)

(72) Inventors: Kouji Nakajima, Tokyo (JP); Yoshiaki Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 254 days.

(21) Appl. No.: 15/815,493

(22) Filed: Nov. 16, 2017

(65) Prior Publication Data

US 2018/0183427 A1   Jun. 28, 2018

(30) Foreign Application Priority Data

Dec. 27, 2016   (JP) .................. 2016-253717

(51) Int. Cl.
*H02H 7/18* (2006.01)
*H03K 17/082* (2006.01)
*H02J 7/00* (2006.01)
*H01L 27/02* (2006.01)
*H01L 29/78* (2006.01)
(Continued)

(52) U.S. Cl.
CPC ..... *H03K 17/0822* (2013.01); *H01L 27/0266* (2013.01); *H01L 29/7815* (2013.01); *H02J 7/0029* (2013.01); *H03K 17/6874* (2013.01); *H01L 27/02* (2013.01); *H02H 5/04* (2013.01); *H02J 7/007* (2013.01); *H02J 7/0031* (2013.01); *H02J 7/00304* (2020.01); *H03K 2217/0027* (2013.01); *H03K 2217/0054* (2013.01)

(58) Field of Classification Search
USPC .................. 361/86–87, 93.7–93.9
See application file for complete search history.

(56) References Cited

U.S. PATENT DOCUMENTS 5,003,246 A   3/1991   Nadd
5,159,425 A   10/1992   Zommer
(Continued)

FOREIGN PATENT DOCUMENTS

EP   0 362 080 A1   4/1990
JP   2003-101025 A   4/2003
(Continued)

OTHER PUBLICATIONS

Extended European Search Report dated May 24, 2018 in corresponding European Application No. 17208002.0.
(Continued)

*Primary Examiner* — Danny Nguyen
(74) *Attorney, Agent, or Firm* — McDermott Will & Emery LLP

(57) ABSTRACT

A semiconductor device includes a first main MOS transistor and a second main MOS transistor of a vertical structure that are inversely coupled to each other in series by sharing a drain electrode and a first sense MOS transistor and a second sense MOS transistor of a vertical structure that are inversely coupled to each other in series by sharing a drain electrode. The first sense MOS transistor is used for detecting the main current of the first main MOS transistor, and the second sense MOS transistor is used for detecting the main current of the second main MOS transistor.

13 Claims, 15 Drawing Sheets

(51) Int. Cl.
  *H03K 17/687* (2006.01)
  *H02H 5/04* (2006.01)

(56) References Cited

U.S. PATENT DOCUMENTS

| | | | |
|---|---|---|---|
| 6,690,061 B2 | 2/2004 | Yoneda et al. | |
| 6,977,513 B2* | 12/2005 | Matsunaga | G01R 19/16542 |
| | | | 320/134 |
| 7,737,664 B2* | 6/2010 | Matsunaga | H01M 10/44 |
| | | | 320/134 |
| 9,270,128 B2 | 2/2016 | Tonomura et al. | |
| 2014/0009189 A1 | 1/2014 | Mauder et al. | |
| 2016/0254809 A1 | 9/2016 | Mochizuki et al. | |

FOREIGN PATENT DOCUMENTS

| | | | |
|---|---|---|---|
| JP | 2010-181351 A | 8/2010 | |
| JP | 2014-096907 A | 5/2014 | |
| JP | 2016-164962 A | 9/2016 | |

OTHER PUBLICATIONS

Japanese Notice of Reasons for Refusal issued in corresponding Japanese Patent Application No. 2016-253717, dated Mar. 3, 2020, with English translation.

* cited by examiner

| SENSE MOS ARRANGEMENT POSITION | L/W | MAIN CURRENT/ SENSE CURRENT | AREA RATIO OF SOURCE DIFFUSION LAYER | DIFFERENCE FROM AREA RATIO |
|---|---|---|---|---|
| A | 5 | 4989 | MAIN MOS DIFFUSION LAYER/SENSE MOS DIFFUSION LAYER = 5000 | 0.2% |
| B | 3 | 4895 | | 2.1% |
| C | 2 | 4023 | | 19.5% |
| D | 1 | 3014 | | 39.7% |

SEMICONDUCTOR DEVICE AND OVERCURRENT PROTECTION DEVICE

CROSS-REFERENCE TO RELATED APPLICATIONS

The disclosure of Japanese Patent Application No. 2016-253717 filed on Dec. 27, 2016 including the specification, drawings and abstract is incorporated herein by reference in its entirety.

BACKGROUND

The present invention relates to a semiconductor device, and is used for, for example, an overcurrent protection device using a semiconductor device as a bidirectional switch.

In a rechargeable battery pack and the like, a semiconductor switch is provided for circuit protection. The semiconductor switch is capable of bi-directionally flowing a current so that the semiconductor switch can be used for both charging and discharging.

For example, a bidirectional switch disclosed in Japanese Unexamined Patent Application Publication No. 2016-164962 includes two MOSFETs (Metal Oxide Semiconductor Field Effect Transistors) that are inversely coupled to each other in series by a common drain. Hereinafter, the MOSFET is referred to as a MOS transistor in some cases.

SUMMARY

As shown in FIG. 2 and the like of Japanese Unexamined Patent Application Publication No. 2016-164962, the rechargeable battery pack in the related art is provided with a shunt resistor in series with the bidirectional switch in order to detect an overcurrent. However, if the shunt resistor is provided, the on-resistance of the entire circuit is increased, resulting in an obstacle to quick charging in the case of the rechargeable battery pack.

The other problems and novel features will become apparent from the description of the specification and the accompanying drawings.

A semiconductor device according to one embodiment includes a first main MOS transistor and a second main MOS transistor that are inversely coupled to each other in series by sharing a drain electrode and a first sense MOS transistor and a second sense MOS transistor that are inversely coupled to each other in series by sharing a drain electrode. The first sense MOS transistor is used for detecting the main current of the first main MOS transistor, and the second sense MOS transistor is used for detecting the main current of the second main MOS transistor.

According to the above-described embodiment, it is possible to suppress an increase in on-resistance of an entire circuit including a bidirectional semiconductor switch.

DETAILED DESCRIPTION

Figure 1:
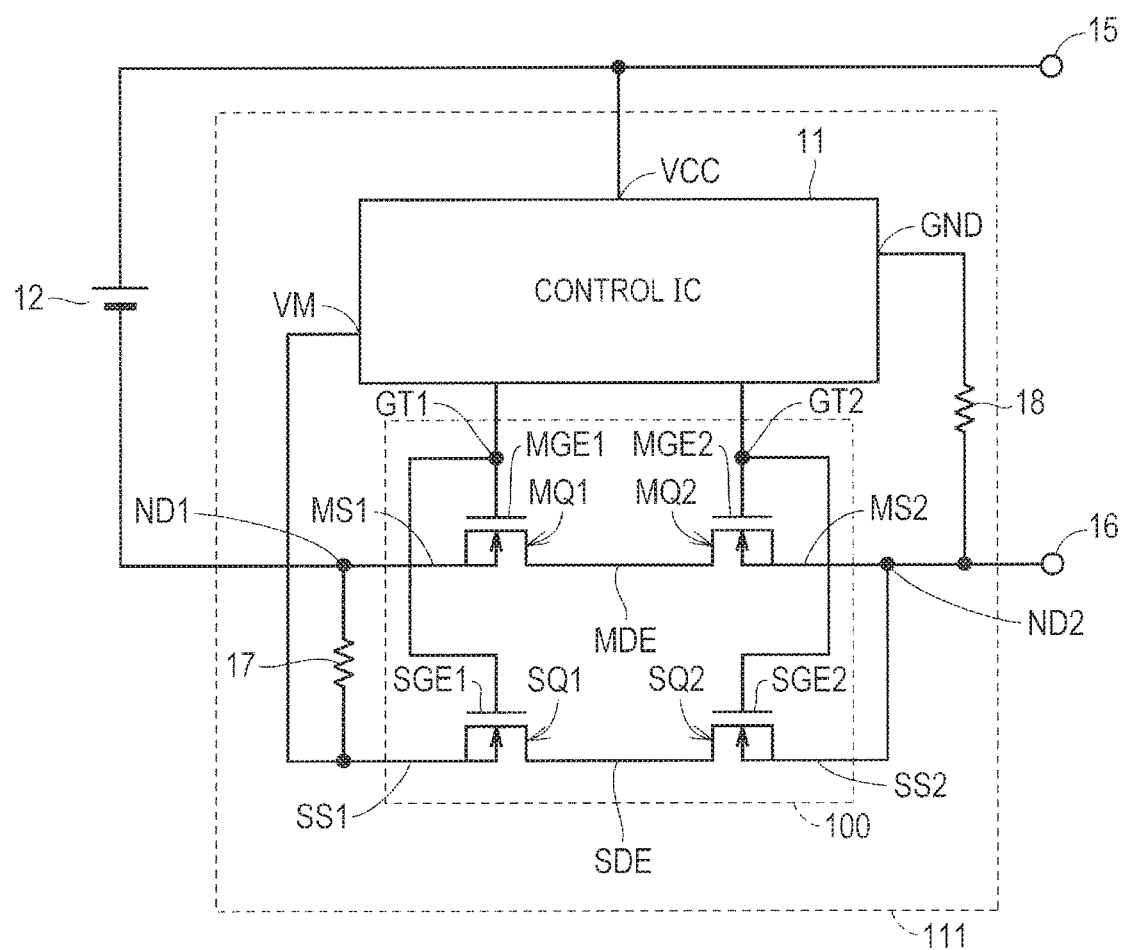
FIG. 1 is a circuit diagram for showing a configuration of an overcurrent protection device having a semiconductor device according to a first embodiment.

Hereinafter, each embodiment will be described in detail with reference to the drawings. It should be noted that the same or corresponding parts are followed by the same reference numerals, and the explanation thereof will not be repeated.

First Embodiment

[Outline Configuration of Overcurrent Protection Device and Semiconductor Device]

FIG. 1 is a circuit diagram for showing a configuration of an overcurrent protection device having a semiconductor device according to a first embodiment. FIG. 1 shows an example in which an overcurrent protection device 111 is applied to a rechargeable battery pack 1.

With reference to FIG. 1, the rechargeable battery pack 1 includes power supply nodes 15 and 16, a rechargeable battery 12 coupled between the power supply nodes 15 and 16, and the overcurrent protection device 111. The charging current and the discharging current of the rechargeable battery 12 are input or output through the power supply nodes 15 and 16. The overcurrent protection device 111 includes nodes ND1 and ND2 that are external connection terminals, a semiconductor device 100 as a bidirectional switch coupled between the nodes ND1 and ND2, resistive elements 17 and 18, and a control IC (Integrated Circuit) 11.

The semiconductor device 100 includes a first main MOS transistor MQ1 and a second main MOS transistor MQ2 that are inversely coupled to each other in series by sharing a drain electrode MDE, and a first sense MOS transistor SQ1 and a second sense MOS transistor SQ2 that are inversely coupled to each other in series by sharing a drain electrode SDE. The sense MOS transistor SQ1 is provided for detecting the main current flowing in the main MOS transistor MQ1, and the sense MOS transistor SQ2 is provided for detecting the main current flowing in the main MOS transistor MQ2. A gate electrode MGE1 of the main MOS transistor MQ1 and a gate electrode SGE1 of the sense MOS transistor SQ1 are coupled to a common gate terminal GT1. A gate electrode MGE2 of the main MOS transistor MQ2 and a gate electrode SGE2 of the sense MOS transistor SQ2 are coupled to a common gate terminal GT2.

Figure 2:
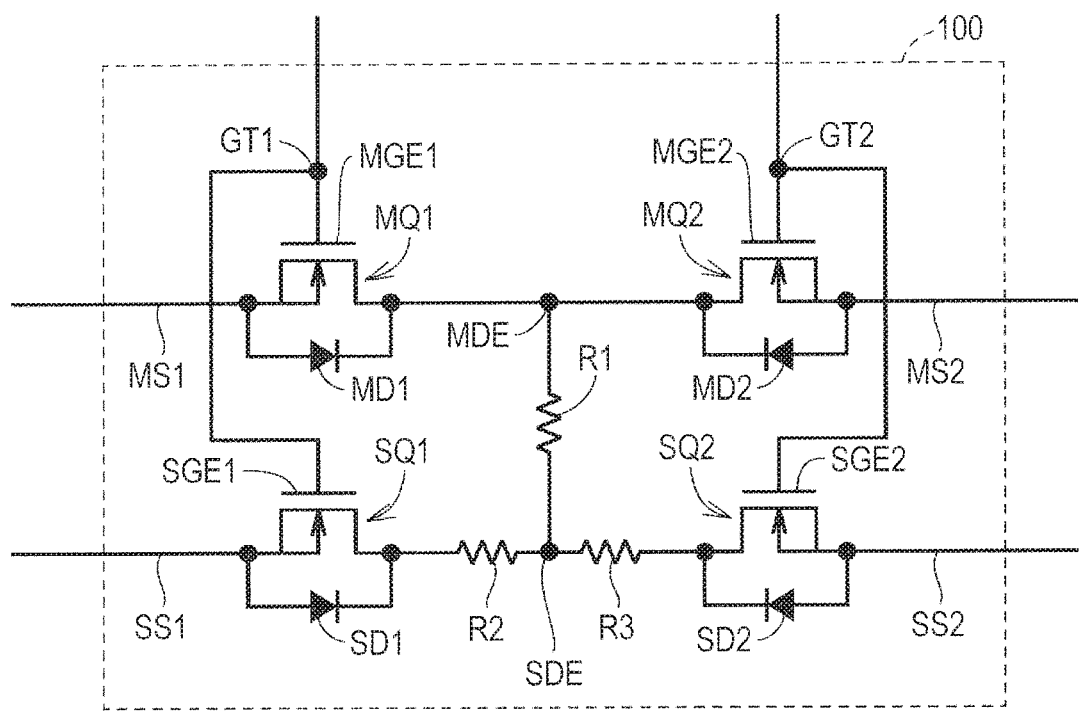
FIG. 2 is an equivalent circuit diagram of the semiconductor device configuring a bidirectional switch of FIG. 1.

FIG. 2 is an equivalent circuit diagram of the semiconductor device configuring the bidirectional switch of FIG. 1. With reference to FIG. 2, the main MOS transistors MQ1 and MQ2 and the sense MOS transistors SQ1 and SQ2 are formed on a common semiconductor substrate, and each MOS transistor has a vertical structure. Therefore, the main MOS transistors MQ1 and MQ2 and the sense MOS transistors SQ1 and SQ2 have parasitic diodes MD1, MD2, SD1, and SD2, respectively. Each parasitic diode is coupled in parallel to the corresponding MOS transistor so that the direction of the source to the drain of the corresponding MOS transistor is the forward direction.

Further, in the case of the first embodiment, the drain electrodes MDE and SDE formed on the back surface side of the substrate are configured using a common metal layer. Further, a drain layer that is an impurity diffusion layer adjacent to the metal layer is also shared by the respective MOS transistors. Therefore, a parasitic resistor R1 having a relatively small resistance value exists between the drain electrode MDE of the main MOS transistors MQ1 and MQ2 and the drain electrode SDE of the sense MOS transistors SQ1 and SQ2.

In order to accurately detect the main current flowing in the main MOS transistors MQ1 and MQ2 by the sense MOS transistors SQ1 and SQ2, it is desirable that the main current flowing between the main MOS transistor MQ1 and the main MOS transistor MQ2 is completely separated from the sense current flowing between the sense MOS transistor SQ1 and the sense MOS transistor SQ2. However, in the case where the parasitic resistor R1 exists between the drain electrode MDE and the drain electrode SDE as described above, the sense current flows from the sense MOS transistor SQ1 to the main MOS transistor MQ2, and the sense current flows from the sense MOS transistor SQ2 to the main MOS transistor MQ1.

Accordingly, the structure of the semiconductor device 100 of the embodiment has been devised so that the parasitic resistor R1 between the drain electrode MDE and the drain electrode SDE is sufficiently larger than the resistance value (R2+R3) between the sense MOS transistor SQ1 and the sense MOS transistor SQ2. Specifically, the structure will be described with reference to FIGS. 4 and 5.

Referring to FIG. 1 again, connection between the semiconductor device 100 and other configurations of the overcurrent protection device 111 will be described. A source electrode MS1 of the main MOS transistor MQ1 configuring the semiconductor device 100 is coupled to a node ND1. A source electrode MS2 of the main MOS transistor MQ2 is coupled to a node ND2. Further, a source electrode SS2 of the sense MOS transistor SQ2 is coupled to the node ND2. It should be noted that the node ND1 is coupled to the negative electrode of the rechargeable battery 12, and the node ND2 is coupled to a power supply node 16 on the low potential side.

A resistive element 17 is coupled between the node ND1 and a source electrode SS1 of the sense MOS transistor SQ1. The resistive element 17 is used as a shunt resistor for detecting the sense current flowing in the sense MOS transistors SQ1 and SQ2. It is desirable that the resistance value of the resistive element 17 is sufficiently smaller than that of the parasitic resistor R1 so that the sense current hardly flows through the parasitic resistor R1 described in FIG. 2. However, if the resistance value of the resistive element 17 is too small, the voltage cannot be detected by the control IC11. Thus, the resistance value of the resistive element 17 is set to, for example, about $\frac{1}{10}$ of the parasitic resistor R1.

The control IC11 includes a power supply voltage terminal VCC, a grounding terminal GND, a voltage monitor terminal VM, and two gate control terminals coupled to the gate terminals GT1 and GT2. The power supply voltage terminal VCC is coupled to a power supply node 15 on the high potential side. The grounding terminal GND is coupled to the power supply node 16 on the low potential side through a resistive element 18. The voltage monitor terminal VM is coupled to the source electrode SS1 of the sense MOS transistor SQ1. Accordingly, the voltage (the potential of the source electrode SS1 of the sense MOS transistor SQ1 in the case of FIG. 1) generated in the resistive element 17 is input to the voltage monitor terminal VM.

The control IC11 outputs to the gate terminal GT1 a control signal for controlling both the main MOS transistor MQ1 and the sense MOS transistor SQ1 to be in the on-state (conductive state) or off-state (non-conductive state). Further, the control IC11 outputs to the gate terminal GT2 a control signal for controlling both the main MOS transistor MQ2 and the sense MOS transistor SQ2 to be in the on-state (conductive state) or off-state (non-conductive state).

[Operation of Overcurrent Protection Device]

Hereinafter, an operation of the overcurrent protection device 111 will be described. In the following description, a case in which the voltage generated in the resistive element 17 does not exceed a threshold value is referred to as a normal state, and a case in which the voltage generated in the resistive element 17 exceeds the threshold value is referred to as an overcurrent state.

Figure 3:
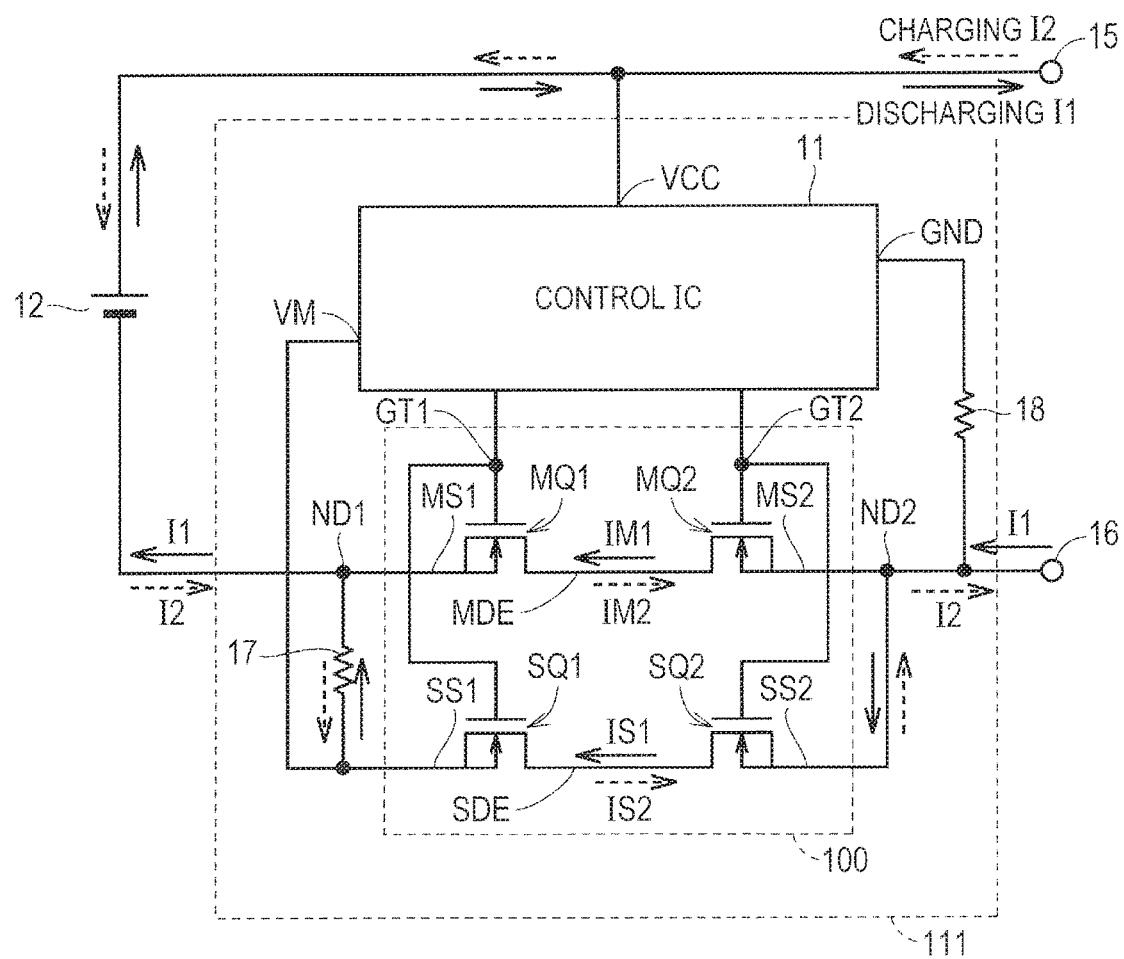
FIG. 3 is a diagram for showing the current direction at the time of discharging of a rechargeable battery and the current direction at the time of charging in the overcurrent protection device of FIG. 1.

FIG. 3 is a diagram for showing the current direction at the time of discharging of the rechargeable battery and the current direction at the time of charging in the overcurrent protection device of FIG. 1. In FIG. 3, the current direction at the time of discharging is indicated by a solid-line arrow, and the current direction at the time of charging is indicated by a broken-line arrow. Hereinafter, the operations of the overcurrent protection device 111 at the time of discharging and at the time of charging will be separately described with reference to FIG. 3.

(1. Operation at the Time of Discharging of Rechargeable Battery)

In the case of the normal state, both the main MOS transistor MQ1 and the main MOS transistor MQ2 are in the on-state and both the sense MOS transistor SQ1 and the sense MOS transistor SQ2 are in the on-state in accordance with the control signals output from the control IC11 to the gate terminals GT1 and GT2, respectively.

A discharging current I1 flows from the positive electrode of the rechargeable battery 12 towards the power supply node 15, and flows from the power supply node 16 towards the negative electrode of the rechargeable battery 12. With respect to the semiconductor device 100 coupled between the power supply node 16 and the negative electrode of the rechargeable battery 12, the discharging current I1 flows from the node ND2 towards the node ND1.

More specifically, the discharging current I1 flowing into the node ND2 is divided into a main current IM1 and a sense current IS1 at the node ND2. The division ratio between the main current IM1 and the sense current IS1 is roughly determined on the basis of the area ratio between the formation region of the source diffusion layer of the main MOS transistor MQ2 and the formation region of the source diffusion layer of the sense MOS transistor SQ2.

The main current IM1 flows in the channel region from the source electrode MS2 of the main MOS transistor MQ2 towards the drain electrode MDE, and further flows in the channel region from the drain electrode MDE of the main MOS transistor MQ1 towards the source electrode MS1. As explained in FIG. 2, the main current IM1 also flows in a parasitic diode MD2 of the main MOS transistor MQ2, but does not flow in a parasitic diode MD1 of the main MOS transistor MQ1 due to the opposite direction. The main current IM1 having passed through the main MOS transistor MQ1 reaches the node ND1.

On the other hand, the sense current IS1 flows in the channel region from the source electrode SS2 of the sense MOS transistor SQ2 towards the drain electrode SDE, and further flows in the channel region from the drain electrode SDE of the sense MOS transistor SQ1 towards the source electrode SS1. As explained in FIG. 2, the sense current IS1 also flows in a parasitic diode SD2 of the sense MOS transistor SQ2, but does not flow in a parasitic diode SD1 of the sense MOS transistor SQ1 due to the opposite direction.

The sense current IS1 having passed through the sense MOS transistor SQ1 further passes through the resistive element 17, and reaches the node ND1. At the node ND1, the main current IM1 and the sense current IS1 join together.

The control IC11 detects the voltage (the potential of the source electrode SS1 of the sense MOS transistor SQ1 in the case of FIG. 3) generated in the resistive element 17 by the sense current IS1. In the case where the voltage generated in the resistive element 17 exceeds a preset threshold value, the control IC11 outputs to the gate terminal GT1 the control signal for setting the main MOS transistor MQ1 to be in the off-state. Accordingly, the sense MOS transistor SQ1 is also set to be in the off-state, and thus the discharging current I1 is blocked by the semiconductor device 100.

It should be noted that even if the main MOS transistor MQ2 and the sense MOS transistor SQ2 are set to be in the off-state at the time of discharging (in the case where a current flows from the node ND2 towards the node ND1 in the case of FIG. 3), a current flows in the parasitic diodes MD2 and SD2 described in FIG. 2, and thus the discharging current I1 cannot be blocked. Therefore, in order to block the discharging current I1, it is necessary to set the main MOS transistor MQ1 and the sense MOS transistor SQ1 to be in the off-state. Alternatively, if all of the main MOS transistors MQ1 and MQ2 and the sense MOS transistors SQ1 and SQ2 are set to be in the off-state, the current flowing in the semiconductor device 100 can be blocked even at the time of discharging or charging.

(2. Operation of Rechargeable Battery at the Time of Charging)

In the case of the normal state, both the main MOS transistor MQ1 and the main MOS transistor MQ2 are in the on-state and both the sense MOS transistor SQ1 and the sense MOS transistor SQ2 are in the on-state in accordance with the control signals output from the control IC11 to the gate terminals GT1 and GT2, respectively.

A charging current I2 flows from the power supply node 15 towards the positive electrode of the rechargeable battery 12, and flows from the negative electrode of the rechargeable battery 12 towards the power supply node 16. With respect to the semiconductor device 100 coupled between the power supply node 16 and the negative electrode of the rechargeable battery 12, the charging current I2 flows from the node ND1 towards the node ND2.

More specifically, the charging current I2 flowing into the node ND1 is divided into a main current IM2 and a sense current IS2 at the node ND1. The division ratio between the main current IM2 and the sense current IS2 is roughly determined on the basis of the area ratio between the formation region of the source diffusion layer of the main MOS transistor MQ1 and the formation region of the source diffusion layer of the sense MOS transistor SQ1.

The main current IM2 flows in the channel region from the source electrode MS1 of the main MOS transistor MQ1 towards the drain electrode MDE, and further flows in the channel region from the drain electrode MDE of the main MOS transistor MQ2 towards the source electrode MS2. As explained in FIG. 2, the main current IM2 also flows in the parasitic diode MD1 of the main MOS transistor MQ1, but does not flow in the parasitic diode MD2 of the main MOS transistor MQ2 due to the opposite direction. The main current IM2 having passed through the main MOS transistor MQ2 reaches the node ND2.

On the other hand, the sense current IS2 reaches the source electrode SS1 of the sense MOS transistor SQ1 through the resistive element 17. The sense current IS2 further flows in the channel region from the source electrode SS1 of the sense MOS transistor SQ1 towards the drain electrode SDE, and flows in the channel region from the drain electrode SDE of the sense MOS transistor SQ2 towards the source electrode SS2. As explained in FIG. 2, the sense current IS2 also flows in the parasitic diode SD1 of the sense MOS transistor SQ1, but does not flow in the parasitic diode SD2 of the sense MOS transistor SQ2 due to the opposite direction. The sense current IS2 having passed through the sense MOS transistor SQ2 and the main current IM2 join together at the node ND2.

The control IC11 detects the voltage (the potential of the source electrode SS2 of the sense MOS transistor SQ2 in the case of FIG. 3) generated in the resistive element 17 by the sense current IS2. In the case where the voltage generated in the resistive element 17 exceeds a preset threshold value, the control IC11 outputs to the gate terminal GT2 the control signal for setting the main MOS transistor MQ2 to be in the off-state. Accordingly, the sense MOS transistor SQ2 is also set to be in the off-state, and thus the charging current I2 is blocked by the semiconductor device 100.

It should be noted that even if the main MOS transistor MQ1 and the sense MOS transistor SQ1 are set to be in the off-state at the time of charging (in the case where a current flows from the node ND1 towards the node ND2 in the case of FIG. 3), a current flows in the parasitic diodes MD1 and SD1 described in FIG. 2, and thus the charging current I2 cannot be blocked. Therefore, in order to block the charging current I2, it is necessary to set the main MOS transistor MQ2 and the sense MOS transistor SQ2 to be in the off-state. Alternatively, if all of the main MOS transistors MQ1 and MQ2 and the sense MOS transistors SQ1 and SQ2 are set to be in the off-state, the current flowing in the semiconductor device 100 can be blocked even at the time of discharging or charging.

[Concrete Structure of Semiconductor Device]

Hereinafter, an example of a concrete structure of the semiconductor device 100 will be described. An example in which a trench gate structure is adopted as a gate electrode will be described below, but other gate electrode structures may be adopted. For example, the gate electrode may have a plate-like shape along the substrate surface. Further, in the following description, the direction parallel to the semiconductor substrate is defined as the X direction and the Y direction, and the direction perpendicular to the semiconductor substrate is defined as the Z direction.

Figure 4:
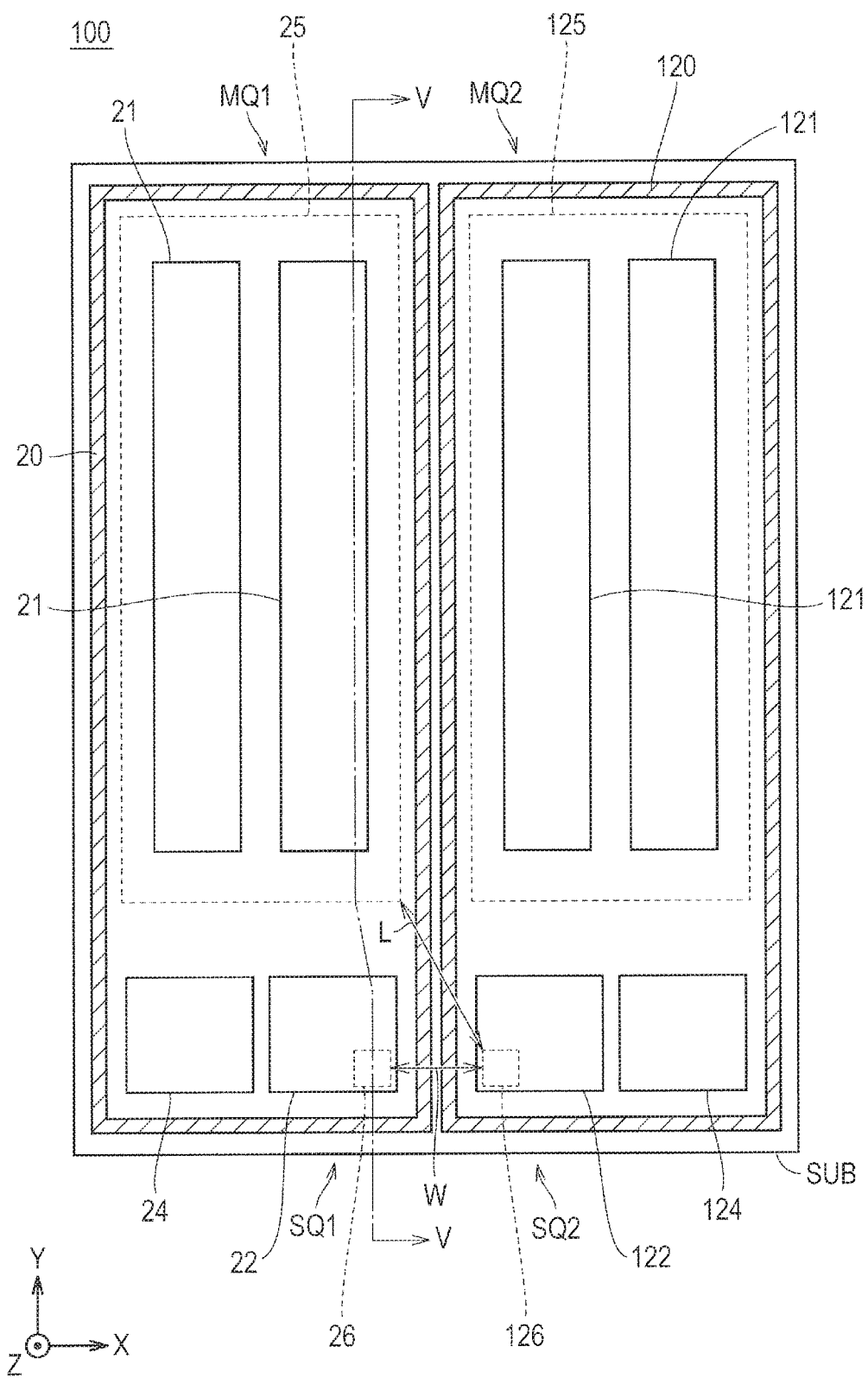
FIG. 4 is a plan view for schematically showing an example of a structure of the semiconductor device corresponding to the equivalent circuit of FIG. 2.
Figure 5:
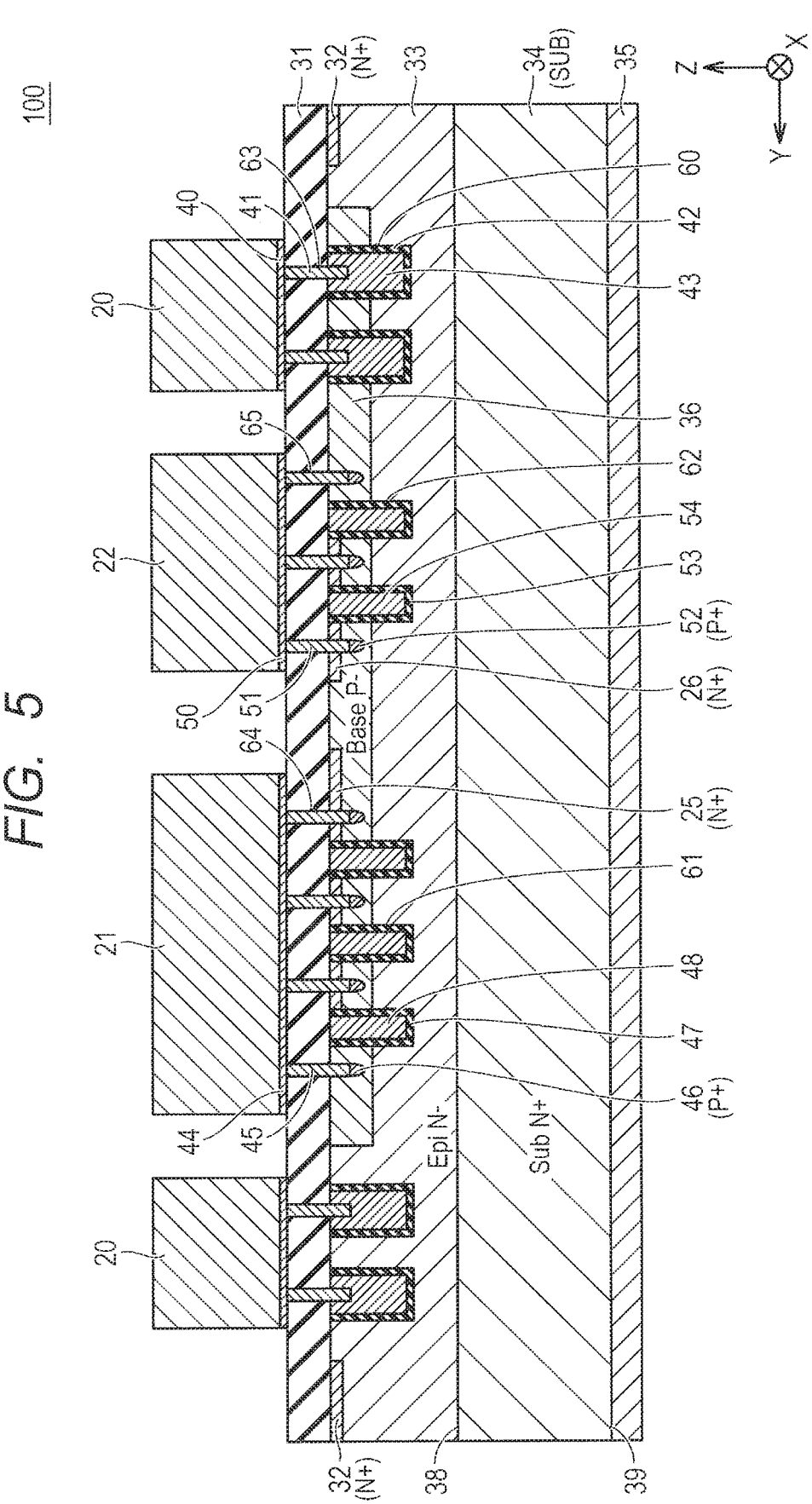
FIG. 5 is a diagram for schematically showing a cross-sectional structure taken along the line V-V of FIG. 4.

FIG. 4 is a plan view for schematically showing an example of a structure of the semiconductor device corresponding to the equivalent circuit of FIG. 2. In FIG. 4, only a part of the configuration shown in the cross-sectional view of FIG. 5 is shown. For example, contacts 41, 45, and 51, trench gates 48 and 54, and the like of FIG. 5 are not illustrated.

With reference to FIG. 4, the semiconductor device 100 has a symmetrical structure with respect to the symmetric axis extending in the Y direction when viewed from the vertical direction of a substrate SUB (namely, when viewing the semiconductor substrate SUB in planar view). As shown in FIG. 4, when viewing the semiconductor substrate SUB in planar view, the main MOS transistor MQ1 and the sense MOS transistor SQ1 are arranged on the −X direction side, and the main MOS transistor MQ2 and the sense MOS transistor SQ2 are arranged on the +X direction side.

A metal gate wiring 20 referred to as a gate finger is arranged so as to surround the formation regions of the main MOS transistor MQ1 and the sense MOS transistor SQ1. The metal gate wiring 20 is coupled to a gate pad 24 through a wiring (not shown). Likewise, a metal gate wiring 120 referred to as a gate finger is arranged so as to surround the formation regions of the main MOS transistor MQ2 and the sense MOS transistor SQ2. The metal gate wiring 120 is coupled to a gate pad 124 through a wiring (not shown).

The formation region of a source diffusion layer 25 of the main MOS transistor MQ1 and the formation region of a source diffusion layer 125 of the main MOS transistor MQ2 are arranged side by side in the X direction. Likewise, a source pad 21 of the main MOS transistor MQ1 and a source pad 121 of the main MOS transistor MQ2 are arranged side by side in the X direction. Here, the source pad 21 corresponds to the source electrode MS1 of FIG. 2, and the source pad 121 corresponds to the source electrode MS2 of FIG. 2.

The formation region of a source diffusion layer 26 of the sense MOS transistor SQ1 and the formation region of a source diffusion layer 126 of the sense MOS transistor SQ2 are arranged side by side in the X direction. The gate pad 24, a sense pad 22, a sense pad 122, and the gate pad 124 are arranged in this order along the X direction. Here, the gate pad 24 corresponds to the gate terminal GT1 of FIG. 2, and the gate pad 124 corresponds to the gate terminal GT2 of FIG. 2. The sense pad 22 corresponds to the source electrode SS1 of FIG. 2, and the sense pad 122 corresponds to the source electrode SS2 of FIG. 2.

FIG. 5 is a diagram for schematically showing a cross-sectional structure taken along the line V-V of FIG. 4. The cross-sectional view of FIG. 5 is intended to show an outline of the structure of the semiconductor device 100, and thus is not completely associated with the plan view of FIG. 4. The dimensions of the drawing are not proportional to the actual dimensions.

Further, in FIG. 5, only three trench gates 48 configuring the gate electrode MGE1 of the main MOS transistor MQ1 are representatively illustrated. However, more trench gates 48 may be actually provided. Likewise, in FIG. 5, only two trench gates 54 configuring the gate electrode SGE1 of the sense MOS transistor SQ1 are representatively illustrated. However, more trench gates 54 may be actually provided.

Hereinafter, the cross-sectional structures of the main MOS transistor MQ1 and the sense MOS transistor SQ1 will be described. The main MOS transistor MQ2 and the sense MOS transistor SQ2 also have the same configurations.

Further, in the following description, it is assumed that each MOS transistor is of an N channel.

With reference to FIG. 5, the semiconductor device 100 is formed on the basis of an N+ semiconductor substrate SUB used as an N+ drain layer 34 (Sub N+). Silicon is generally used as the material of the semiconductor substrate, but other semiconductor materials may be used. In the following description, the surface on the +Z direction side of the N+ semiconductor substrate SUB will be referred to as a main surface 38, and the surface on the −Z direction side will be referred to as a back surface 39.

An N− drift layer 33 (Epi N−) is formed on the main surface 38 of the N+ semiconductor substrate SUB by an epitaxial growth method. Various impurity layers are formed in the N− drift layer 33. Specifically, the semiconductor device 100 includes a P− base diffusion layer 36 formed near the surface of the N− drift layer 33, N+ source diffusion layers 25 and 26 formed near the surface of the P− base diffusion layer 36, and an N+ semiconductor layer 32 formed near the surface of the N− drift layer 33 and at the periphery of the substrate.

In the formation region of the N+ source diffusion layer 25 of the main MOS transistor MQ1, a plurality of trenches 61 reaching the inside of the N− drift layer 33 through the N+ source diffusion layer 25 and the P− base diffusion layer 36 is formed. Further, in the formation region of the N+ source diffusion layer 26 for the sense MOS transistor SQ1, a plurality of trenches 62 reaching the inside of the N− drift layer 33 through the N+ source diffusion layer 26 and the P− base diffusion layer 36 is formed.

In the formation region of the source diffusion layer 25, the respective trenches 61 extend in the X direction, and are arranged side by side in the Y direction as the whole trench 61. In the formation region of the source diffusion layer 26, the respective trenches 62 extend in the X direction, and are arranged side by side in the Y direction as the whole trench 62.

Further, a plurality of trenches 60 that reaches the inside from the surface of the N− drift layer 33 or reaches the inside of the N− drift layer 33 through the P− base diffusion layer 36 is formed under the metal gate wiring 20.

A gate insulating film 47 is formed on the inner surface of each trench 61, and a trench gate 48 is formed, as a buried electrode, inside each trench 61 with the gate insulating film 47 interposed therebetween. Likewise, a gate insulating film 53 is formed on the inner surface of each trench 62, and a trench gate 54 is formed, as a buried electrode, inside each trench 62 with the gate insulating film 53 interposed therebetween. Further, an insulating film 42 is formed on the inner surface of each trench 60, and a gate wiring 43 is formed inside each trench 60 with the insulating film 42 interposed therebetween. The gate wiring 43 is coupled to the trench gates 48 and 54.

The semiconductor device 100 further includes an interlayer insulating layer 31, the contacts 41 and 45, the metal gate wiring 20, the source pad 21, the sense pad 22, and a metal drain electrode 35. The interlayer insulating layer 31 is formed to cover the N− drift layer 33, the N+ source diffusion layer 25, the N+ source diffusion layer 26, the N+ semiconductor layer 32, the trench gate 48, the trench gate 54, and the gate wiring 43.

The source pad 21 is formed on the interlayer insulating layer 31 with a barrier metal film 44 such as a TiW (titanium tungsten) film interposed therebetween. The source pad 21 is electrically coupled to the N+ source diffusion layer 25 and the P− base diffusion layer 36 through the contacts 45 made of a metal material. Each contact 45 penetrates the interlayer insulating layer 31 and the N+ source diffusion layer 25 to reach the inside of the P− base diffusion layer 36. A P+ contact region 46 is formed at the tip of each contact 45. The contacts 45 are arranged between the adjacent trench gates 48 and outside the outermost trench gates 48.

The sense pad 22 is formed on the interlayer insulating layer 31 with a barrier metal film 50 such as a TiW film interposed therebetween. The sense pad 22 is electrically coupled to the N+ source diffusion layer 26 and the P− base diffusion layer 36 through the contacts 51 made of a metal material. Each contact 51 penetrates the interlayer insulating layer 31 and the N+ source diffusion layer 26 to reach the inside of the P− base diffusion layer 36. A P+ contact region 52 is formed at the tip of each contact 51. The contacts 51 are arranged between the adjacent trench gates 54 and outside the outermost trench gates 54.

The metal gate wiring 20 is formed on the interlayer insulating layer 31 with a barrier metal film 40 such as a TiW film interposed therebetween. The metal gate wiring 20 is coupled to the gate wiring 43 through the contacts 41 made of a metal material.

The metal drain electrode 35 is formed on a back surface 39 of the N+ semiconductor substrate SUB, namely, on the surface of the N+ drain layer 34. The metal drain electrode 35 corresponds to the drain electrodes MDE and SDE of FIG. 2.

[Characteristics of Structure of Semiconductor Device]

In the structure of the semiconductor device 100 shown in FIG. 4 and FIG. 5, in the case where the source pad 21 is on the high potential side, the main current flowing in the main MOS transistor MQ1 reaches the metal drain electrode 35 from the source pad 21 through the contacts 45, the P− base diffusion layer 36, the N− drift layer 33, and the N+ drain layer 34 in this order. In the case where the source pad 21 is on the low potential side, the main current reaches the source pad 21 from the metal drain electrode 35 through the N+ drain layer 34, the N− drift layer 33, the channel region formed in the P− base diffusion layer 36, the N+ source diffusion layer 25, and the contacts 45 in this order. The same applies to the main MOS transistor MQ2. On the other hand, most of the main current flowing between the main MOS transistor MQ1 and the main MOS transistor MQ2 flows through the metal drain electrode 35 having a low resistance. In order to allow a sufficient current to flow, the metal drain electrode 35 is formed to have a thickness of, for example, 3 µm or more.

In the case where the sense pad 22 is on the high potential side, the sense current flowing in the sense MOS transistor SQ1 reaches the metal drain electrode 35 from the sense pad 22 through the contacts 51, the P− base diffusion layer 36, the N− drift layer 33, and the N+ drain layer 34 in this order. In the case where the sense pad 22 is on the low potential side, the sense current reaches the sense pad 22 from the metal drain electrode 35 through the N+ drain layer 34, the N− drift layer 33, the channel region formed in the P− base diffusion layer 36, the N+ source diffusion layer 26, and the contacts 51 in this order. The same applies to the sense MOS transistor SQ2. On the other hand, most of the sense current flowing between the sense MOS transistor SQ1 and the sense MOS transistor SQ2 flows through the metal drain electrode 35 having a low resistance.

Therefore, in order to allow the sense current to hardly flow between the sense MOSFET and the main MOSFET through the metal drain electrode 35, it is necessary to sufficiently increase the shortest distance L between the source diffusion layer 26 and the source diffusion layer 125 and the shortest distance L between the source diffusion layer 25 and the source diffusion layer 126 as compared to the shortest distance W between the source diffusion layer 26 and the source diffusion layer 126 in FIG. 4. A simulation was carried out to determine the value of L/W with which the sense current hardly flowed between the sense MOS transistors SQ1 and SQ2 and the main MOS transistors MQ1 and MQ2. Hereinafter, the result of the simulation will be described.

Figure 6:
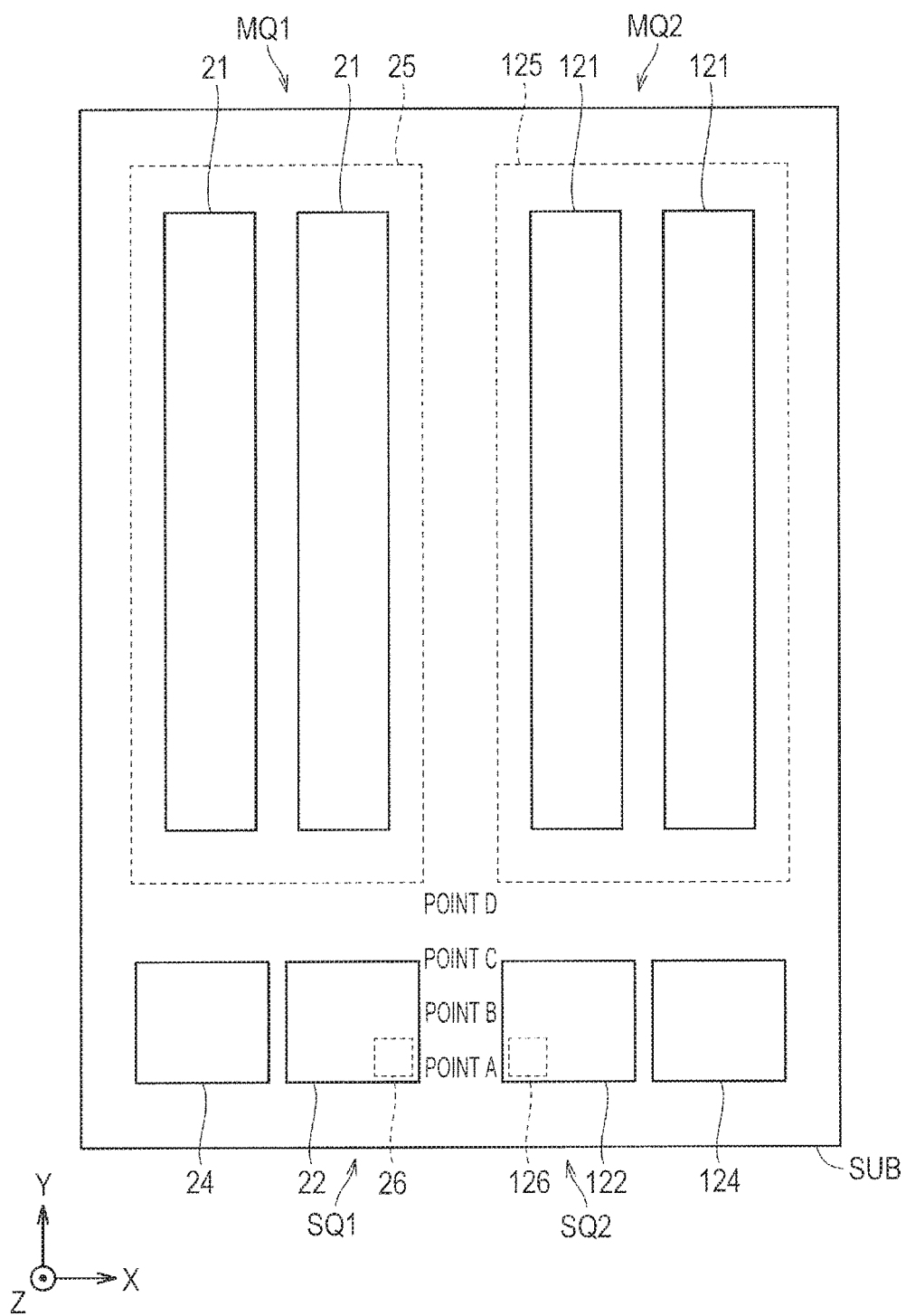
FIG. 6 is a diagram for explaining the arrangement position of a sense MOSFET in a simulation.

FIG. 6 is a diagram for explaining the arrangement position of the sense MOSFET in the simulation. As shown in FIG. 6, the simulation was carried out in the case where the formation region of the source diffusion layer 26 of the sense MOS transistor SQ1 was changed to a point A, B, C, or D.

Specifically, L/W is 5 in the case of the point A, L/W is 3 in the case of the point B, L/W is 2 in the case of the point C, and L/W is 1 in the case of the point D. The ratio of the area of the formation region of the source diffusion layer 25 of the main MOS transistor MQ1 to the area of the formation region of the source diffusion layer 125 of the sense MOS transistor SQ1 was set to 5000. The thickness of the metal drain electrode 35 was set to 3 µm. Under these conditions, the ratio of the main current flowing between the main MOS transistor MQ1 and the main MOS transistor MQ2 to the sense current flowing between the sense MOS transistor SQ1 and the sense MOS transistor SQ2 was calculated.

Figures 7, 8:
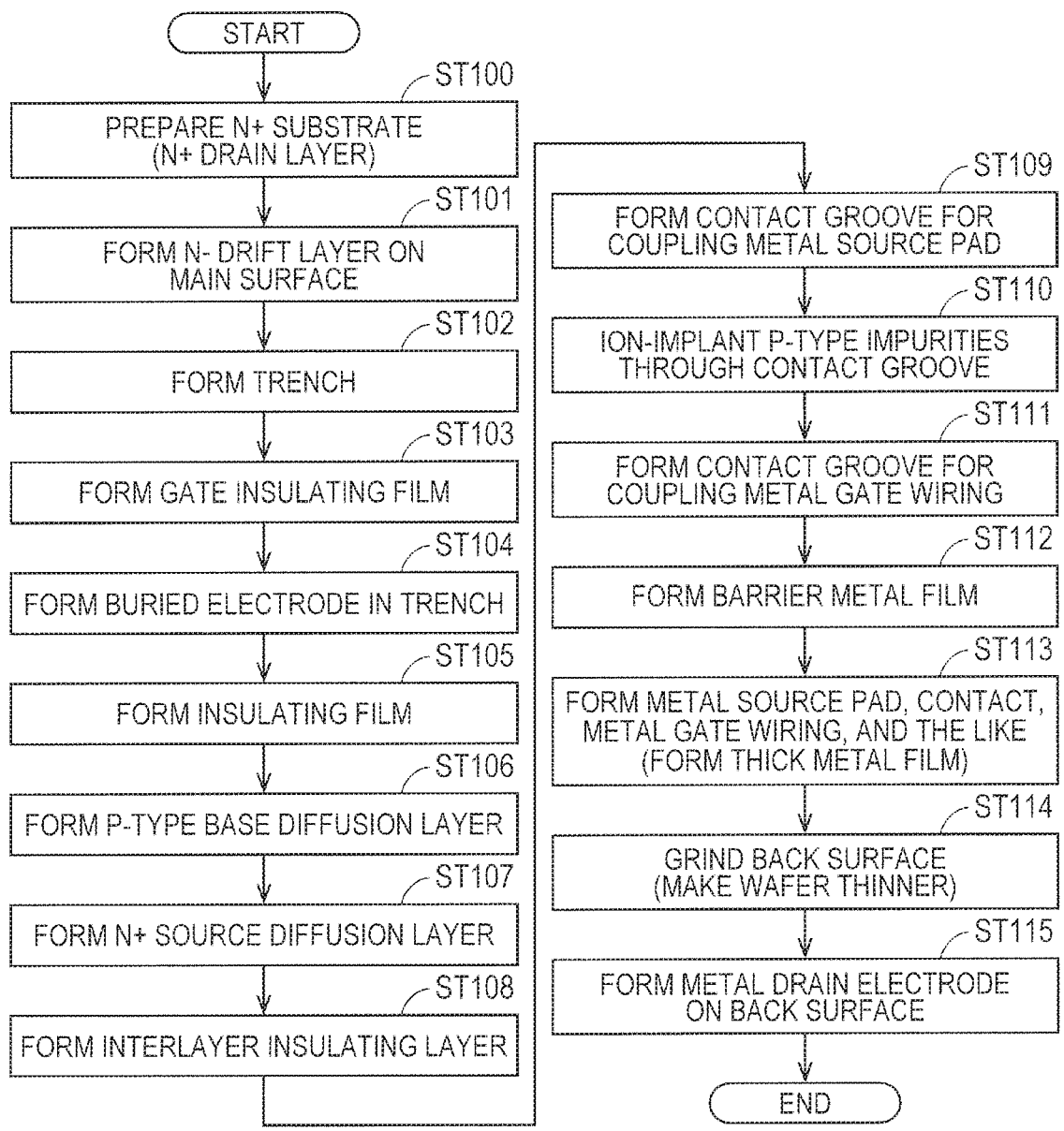
FIG. 7 is a diagram for showing simulation results in a table format.
FIG. 8 is a flowchart for showing a manufacturing method of the semiconductor device of FIG. 4 and FIG. 5.

FIG. 7 is a diagram for showing simulation results in a table format. As shown in FIG. 7, if the value of L/W is 3 or larger, an error with respect to the area ratio of the source diffusion layer is within about 2%, and thus the magnitude of the main current can be detected with sufficient accuracy using the main MOS transistors SQ1 and SQ2.

[Manufacturing Method of Semiconductor Device]

Hereinafter, an example of a manufacturing method of the semiconductor device 100 of the embodiment will be briefly described.

FIG. 8 is a flowchart for showing a manufacturing method of the semiconductor device of FIG. 4 and FIG. 5. With reference to FIG. 4, FIG. 5, and FIG. 8, the N+ semiconductor substrate SUB of silicon single crystal is prepared first (Step ST100 of FIG. 8).

Next, silicon doped on the main surface 38 of the N+ semiconductor substrate SUB is epitaxially grown to form the N− drift layer 33 (Step ST101).

Next, the trenches 60, 61, and 62 are formed in the N− drift layer 33 (Step ST102). Specifically, a hard mask film for forming a trench is formed on the surface of the N− drift layer 33 by using a lithography process, and anisotropic dry etching is performed using the hard mask film to form the trenches 60, 61, and 62. After forming the trenches 60, 61, and 62, the hard mask film is removed by wet etching.

Next, the insulating film 42 or the gate insulating film 47 is formed on substantially the entire surfaces of the surface of the N− drift layer 33 and the inner surfaces of the trenches 60, 61, and 62 by, for example, thermal oxidation (Step ST103).

Next, a doped poly-silicon film doped with, for example, phosphorus is formed on substantially the entire surface of the insulating film 42 or the gate insulating film 47 so as to bury the trenches 60, 61, and 62 by, for example, CVD (Chemical Vapor Deposition) or the like. The doped poly-silicon film outside the trench 60, 61, and 62 is removed by, for example, wet etching. Accordingly, the gate wiring 43 is formed in the trench 60, and the buried electrodes (namely, the trench gates 48 and 54) are formed in the trenches 61 and 62 (Step ST104).

Next, a relatively-thin insulating film (for example, 58 of FIG. 10) such as a silicon oxide film is formed on substantially the entire surface of the main surface 38 of the N− semiconductor substrate SUB by thermal oxidation, CVD, or the like (Step ST105).

Next, P-type impurities are ion-implanted using a resist film formed by the lithography process as a mask. Thereafter, the P− base diffusion layer 36 is formed by thermal diffusion (Step ST106). The unnecessary resist film is removed by ashing or the like.

Next, N-type impurities are ion-implanted using the resist film formed by the lithography process as a mask. Accordingly, the N+ source diffusion layers 25 and 26 are formed in the upper region of the P− base diffusion layer 36 (Step ST107). At the same time, the N+ semiconductor layer 32 is also formed at the periphery of the substrate. The unnecessary resist film is removed by ashing or the like.

Next, the interlayer insulating layer 31 is formed on substantially the entire surface of the main surface 38 side of the N+ semiconductor substrate SUB by CVD, coating, or the like (Step ST108). As a material of the interlayer insulating layer 31, for example, a PSG (Phosphsilicate Glass) film, a BPSG (Borophosphsilicate Glass) film, an NSG (Non-doped Silicate Glass) film, an SOG (Spin-On-Glass), or a composite film thereof can be used.

Next, contact grooves 64 for coupling the source pad 21 are formed between the adjacent trench gates 48 and outside the outermost trench gates 48 (Step ST109). Likewise, contact grooves 65 for coupling the sense pad 22 are formed between the adjacent trench gates 54 and outside the outermost trench gates 54. These contact grooves 64 and 65 are formed by, for example, anisotropic dry etching or the like using the resist film formed by the lithography process as a mask.

Next, the P+ contact region 46 is formed near the bottom surfaces of the contact grooves 64 and 65 by ion implantation using the resist film as a mask (Step ST110). Thereafter, the unnecessary resist film is removed by ashing or the like.

Next, contact grooves 63 for coupling the metal gate wiring 20 to the gate wiring 43 are formed (Step ST111). Specifically, for example, the contact grooves 63 are formed by anisotropic dry etching or the like using the resist film formed by the lithography process as a mask. The unnecessary resist film is removed by asking or the like.

Next, the barrier metal film such as TiW is formed on substantially the entire surfaces of the formed contact grooves 63, 64, and 65 and the interlayer insulating layer 31 (Step ST112). Subsequently, an aluminum based thick metal film is formed by sputtering film formation or the like (Step ST113). Thereafter, the contacts 45, 51, and 63, the metal gate wiring 20, the source pad 21, and the sense pad 22 are formed by etching the thick metal film and the barrier metal film using a lithography process and etching.

Next, the thickness of the substrate is adjusted by grinding the back surface 39 (back surface) of the N+ semiconductor substrate SUB (Step ST114).

Next, the metal drain electrode 35 is formed on substantially the entire surface of the back surface 39 of the N+ semiconductor substrate SUB by sputtering film formation or the like (Step ST115). As described above, the semiconductor device 100 having the configuration of FIG. 4 and FIG. 5 is completed.

Effect of First Embodiment

As described above, the semiconductor device of the first embodiment has a structure in which the main MOS transistors MQ1 and MQ2 of a vertical structure that are inversely coupled to each other in series and the sense MOS transistors SQ1 and SQ2 of a vertical structure that are inversely coupled to each other in series are formed on the same substrate. By providing the sense MOS transistors SQ1 and SQ2, it is not necessary to couple a shunt resistor for detecting a current in series with the main MOS transistors MQ1 and MQ2. Therefore, it is possible to suppress an increase in resistance in the route of the main current path in the on-state.

Further, the detection accuracy of the main current by the sense MOSFET can be improved by setting the ratio L/W of the shortest distance L between the source diffusion layers 25 and 26 of the main MOSFET and the source diffusion layers 125 and 126 of the sense MOSFET to the shortest distance W between the source diffusion layer 26 and the source diffusion layer 126 of the sense MOSFET to 3 or larger.

Second Embodiment

A semiconductor device of a second embodiment is obtained by changing the arrangements of source pads 21 and 121, sense pads 22 and 122, and gate pads 24 and 124 from those in the case of the first embodiment. Hereinafter, the second embodiment will be described in detail with reference to the drawings.

Figure 9:
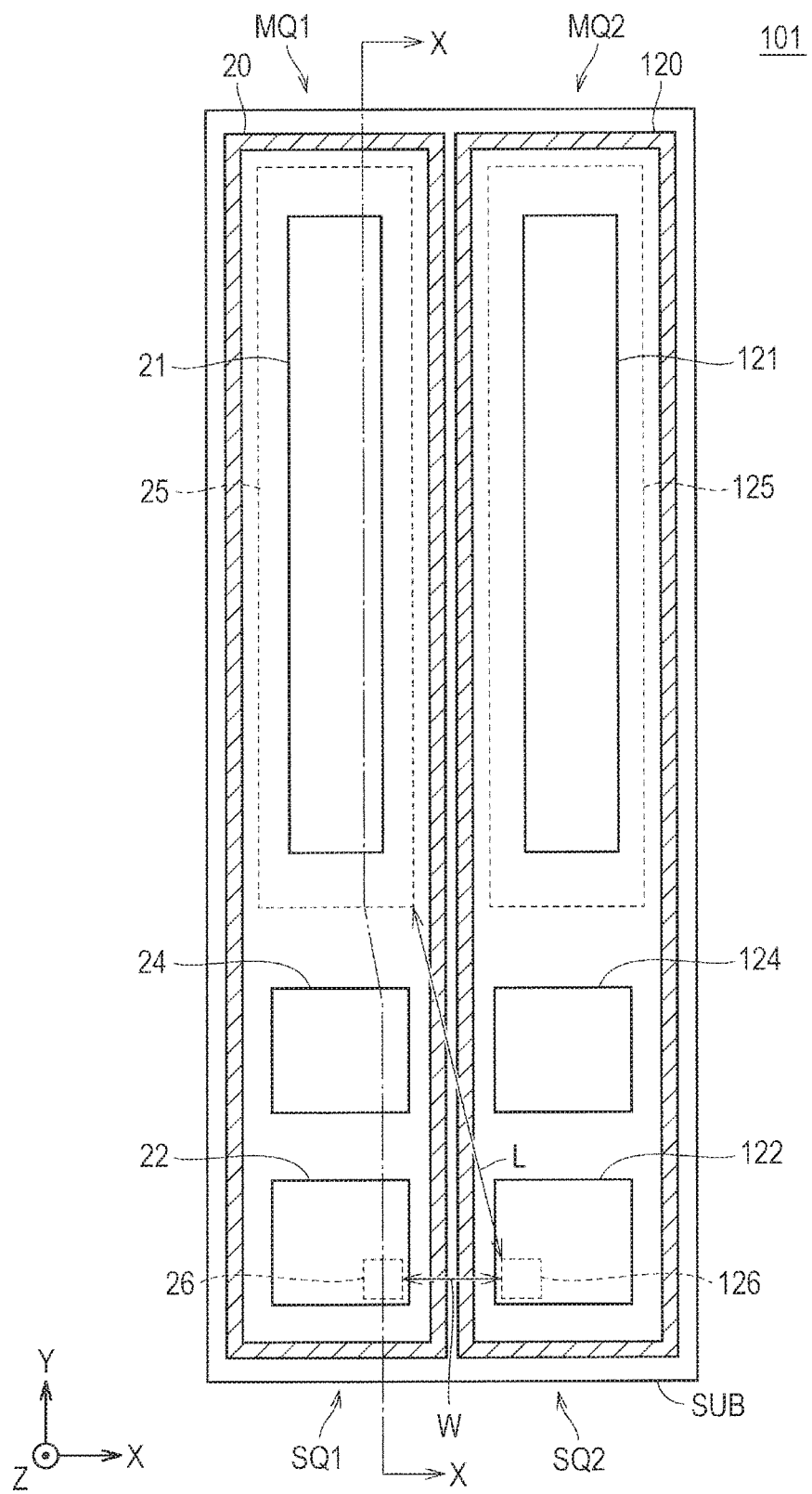
FIG. 9 is a plan view of a semiconductor device according to a second embodiment.

FIG. 9 is a plan view of the semiconductor device according to the second embodiment. With reference to FIG. 9, the source pad 21 of a main MOS transistor MQ1 and the source pad 121 of a main MOS transistor MQ2 are arranged side by side in the X direction. Likewise, the sense pad 22 of a sense MOS transistor SQ1 and the sense pad 122 of a sense MOS transistor SQ2 are arranged side by side in the X direction. These arrangements are the same as those in the case of the first embodiment shown in FIG. 4.

On the other hand, in the semiconductor device 101 of FIG. 9, the gate pad 24 used in the main MOS transistor MQ1 and the sense MOS transistor SQ1 is arranged between the source pad 21 and the sense pad 22. Likewise, the gate pad 124 used in the main MOS transistor MQ2 and the sense MOS transistor SQ2 is arranged between the source pad 121 and the sense pad 122.

As described above, by arranging the gate pad 24 and the gate pad 124, the ratio L/W of the shortest distance L between source diffusion layers 25 and 26 of the main MOSFET and source diffusion layers 125 and 126 of the sense MOSFET to the shortest distance W between the source diffusion layer 26 and the source diffusion layer 126 of the sense MOSFET can be further increased. As a result, the sense current can be prevented from flowing between the sense MOS transistors SQ1 and SQ2 and the main MOS transistors MQ1 and MQ2 as much as possible, and thus the detection accuracy of the main current by the sense MOSFET can be improved.

Figure 10:
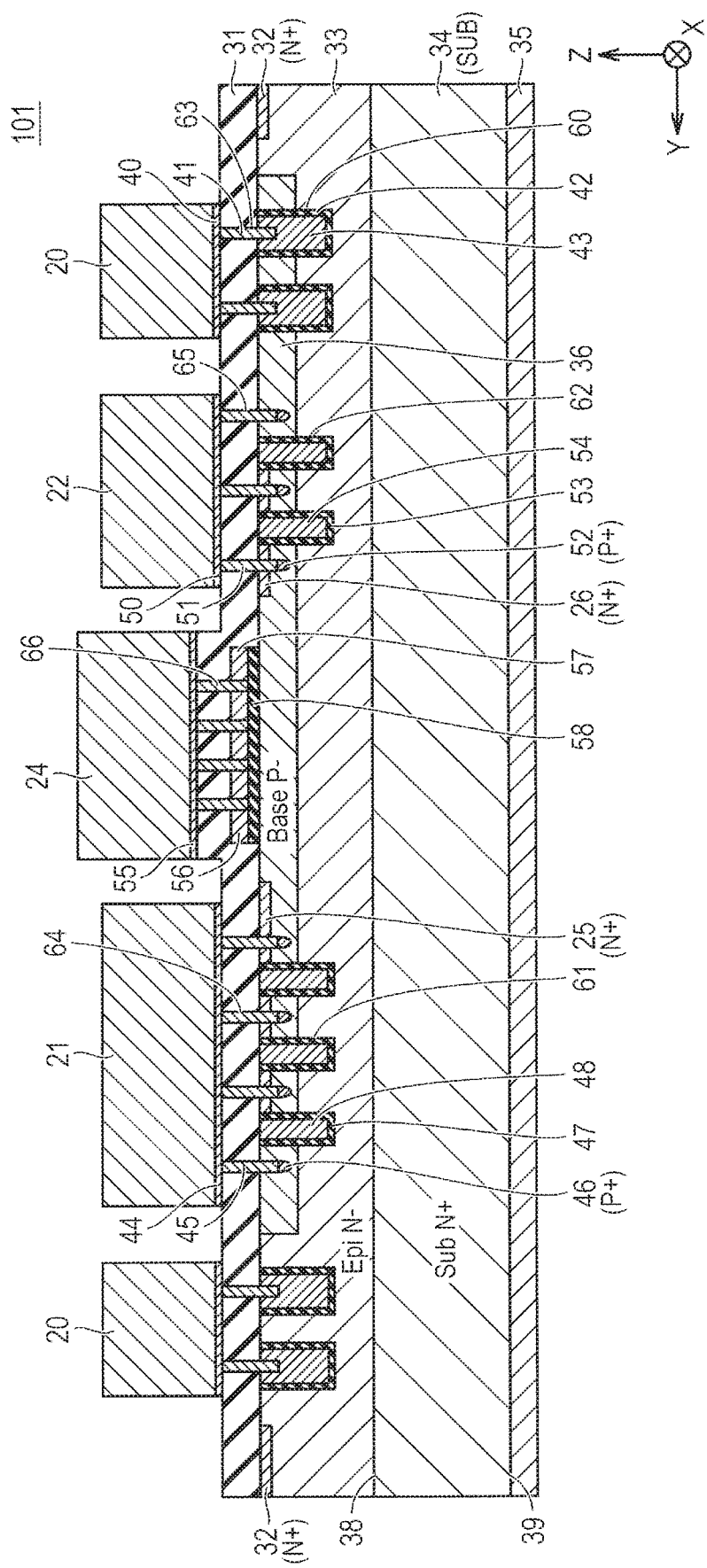
FIG. 10 is a diagram for schematically showing a cross-sectional structure taken along the line X-X of FIG. 9.

FIG. 10 is a diagram for schematically showing a cross-sectional structure taken along the line X-X of FIG. 9. The cross-sectional view of FIG. 10 is different from the cross-sectional view of FIG. 5 in that a cross-sectional structure near the gate pad 24 is added. Under the gate pad 24, a field plate electrode 57 is formed through a thin insulating film 58. An interlayer insulating layer 31 is formed above the field plate electrode 57, and further the gate pad 24 is formed above the interlayer insulating layer 31 through a barrier metal film 55. The gate pad 24 and the field plate electrode 57 are coupled to each other through contacts 66. The other points in FIG. 10 are the same as those in FIG. 5. Thus, the

Third Embodiment

A semiconductor device 102 of a third embodiment is different from the semiconductor device 100 of the first embodiment in that sense MOS transistors SQB1 and SQB2 that are inversely coupled to each other in series are further provided. Hereinafter, the third embodiment will be described in detail with reference to the drawings.

[Outline Configurations of Overcurrent Protection Device and Semiconductor Device]

Figure 11:
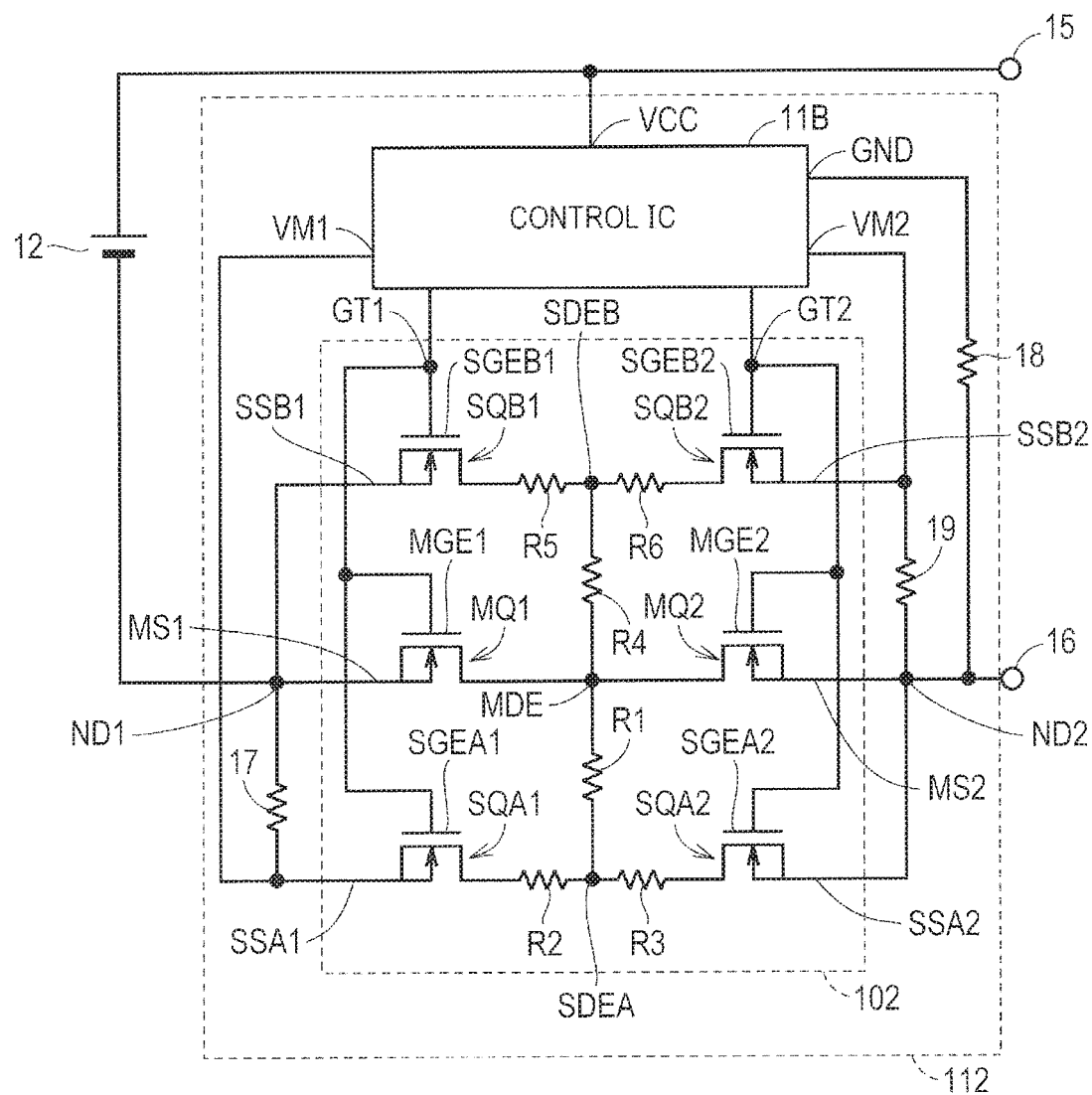
FIG. 11 is a diagram for showing a configuration of an overcurrent protection device including a semiconductor device according to a third embodiment.

FIG. 11 is a diagram for showing a configuration of an overcurrent protection device including a semiconductor device according to the third embodiment. With reference to FIG. 11, a rechargeable battery pack 2 includes power supply nodes 15 and 16, a rechargeable battery 12 coupled between the power supply nodes 15 and 16, and an overcurrent protection device 112. The overcurrent protection device 112 includes nodes ND1 and ND2 that are external connection terminals, the semiconductor device 102 coupled between the nodes ND1 and ND2, resistive elements 17, 18, and 19, and a control IC (Integrated Circuit) 11B.

The semiconductor device 102 includes a first main MOS transistor MQ1 and a second main MOS transistor MQ2 that are inversely coupled to each other in series by sharing a drain electrode MDE. Further, the semiconductor device 102 includes a first sense MOS transistor SQA1 and a second sense MOS transistor SQA2 that are inversely coupled to each other in series by sharing a drain electrode SDEA, and a third sense MOS transistor SQB1 and a fourth sense MOS transistor SQB2 that are inversely coupled to each other in series by sharing a drain electrode SDEB.

The sense MOS transistors SQA1 and SQB1 are provided for detecting the main current flowing in the main MOS transistor MQ1, and the sense MOS transistors SQA2 and SQB2 are provided for detecting the main current flowing in the main MOS transistor MQ2. A gate electrode MGE1 of the main MOS transistor MQ1, a gate electrode SGEA1 of the sense MOS transistor SQA1, and a gate electrode SGEB1 of the sense MOS transistor SQB1 are coupled to a common gate terminal GT1. A gate electrode MGE2 of the main MOS transistor MQ2, a gate electrode SGEA2 of the sense MOS transistor SQA2, and a gate electrode SGEB2 of the sense MOS transistor SQB2 are coupled to a common gate terminal GT2.

The main MOS transistors MQ1 and MQ2 and the sense MOS transistors SQA1, SQA2, SQB1, and SQB2 are formed on a common semiconductor substrate, and each MOS transistor has a vertical structure. Therefore, each of the main MOS transistors MQ1 and MQ2 and the sense MOS transistors SQA1, SQA2, SQB1, and SQB2 has a parasitic diode (not shown). Each parasitic diode is coupled in parallel to the corresponding MOS transistor so that the direction of the source to the drain of the corresponding MOS transistor is the forward direction.

Further, in the case of the third embodiment, the drain electrodes MDE, SDEA, and SDEB formed on the back surface side of the substrate are configured using a common metal layer. Further, a drain layer that is an impurity diffusion layer adjacent to the metal layer is also shared by the respective MOS transistors. Therefore, a parasitic resistor R1 exists between the drain electrode MDE of the main MOS transistors MQ1 and MQ2 and the drain electrode SDEA of the sense MOS transistors SQ1 and SQ2. Likewise, a parasitic resistor R4 exists between the drain electrode MDE of the main MOS transistors MQ1 and MQ2 and the drain electrode SDEB of the sense MOS transistors SQB1 and SQB2.

As described in FIG. 2 and FIG. 4, in order to accurately detect the main current flowing in the main MOS transistors MQ1 and MQ2, the resistance value of the parasitic resistor R1 needs to be sufficiently larger than the resistance value (R2+R3) between the sense MOS transistor SQA1 and the sense MOS transistor SQA2. Further, the resistance value of the parasitic resistor R4 needs to be sufficiently larger than the resistance value (R5+R6) between the sense MOS transistor SQB1 and the sense MOS transistor SQB2.

Next, connection between the semiconductor device 102 and other configurations of the overcurrent protection device 112 will be described. A source electrode MS1 of the main MOS transistor MQ1 configuring the semiconductor device 102 is coupled to the node ND1. A source electrode MS2 of the main MOS transistor MQ2 is coupled to the node ND2. Further, a source electrode SSA2 of the sense MOS transistor SQA2 is coupled to the node ND2. A source electrode SSB1 of the sense MOS transistor SQB1 is coupled to the node ND1. It should be noted that the node ND1 is coupled to the negative electrode of the rechargeable battery 12, and the node ND2 is coupled to a power supply node 16 on the low potential side.

The resistive element 17 is coupled between the node ND1 and a source electrode SSA1 of the sense MOS transistor SQA1. The resistive element 19 is coupled between the node ND2 and a source electrode SSB2 of the sense MOS transistor SQB2. It is desirable that the resistance value of the resistive element 17 is sufficiently smaller than that of the parasitic resistor R1 so that the sense current hardly flows through the parasitic resistor R1. However, if the resistance value of the resistive element 17 is too small, the voltage cannot be detected by the control IC11. Thus, the resistance value of the resistive element 17 is set to, for example, about $1/10$ of the parasitic resistor R1. Likewise, it is desirable that the resistance value of the resistive element 19 is sufficiently smaller than that of the parasitic resistor R4 so that the sense current hardly flows through the parasitic resistor R4. However, if the resistance value of the resistive element 19 is too small, the voltage cannot be detected by the control IC11. Thus, the resistance value of the resistive element 19 is set to, for example, about $1/10$ of the parasitic resistor R1.

The control IC11B includes a power supply voltage terminal VCC, a grounding terminal GND, voltage monitor terminals VM1 and VM2, and two gate control terminals coupled to the gate terminals GT1 and GT2. The power supply voltage terminal VCC is coupled to a power supply node 15 on the high potential side. The grounding terminal GND is coupled to the node ND2 (further, the power supply node 16 on the low potential side) through the resistive element 18. The voltage monitor terminal VM1 is coupled to the source electrode SSA1 of the sense MOS transistor SQA1. Accordingly, the voltage (the potential of the source electrode SSA1 of the sense MOS transistor SQA1 in the case of FIG. 11) generated in the resistive element 17 is input to the voltage monitor terminal VM1. The voltage monitor terminal VM2 is coupled to the source electrode SSB2 of the sense MOS transistor SQB2. Accordingly, the voltage (the potential of the source electrode SSB2 of the sense MOS transistor SQB2 in the case of FIG. 11) generated in the resistive element 19 is input to the voltage monitor terminal VM2.

The control IC11 outputs to the gate terminal GT1 a control signal for controlling all of the main MOS transistor MQ1 and the sense MOS transistors SQA1 and SQB1 to be in the on-state (conductive state) or off-state (non-conductive state). The control IC11 further outputs to the gate terminal GT2 a control signal for controlling all of the main MOS transistor MQ2 and the sense MOS transistors SQA2 and SQB2 to be in the on-state (conductive state) or off-state (non-conductive state).

[Operation of Overcurrent Protection Device]

Hereinafter, an operation of the overcurrent protection device 112 will be described. In the following description, a case in which neither the voltage generated in the resistive element 17 nor the voltage generated in the resistive element 19 exceeds a threshold is referred to as a normal state, and a case in which any one of the voltages generated in the resistive element 17 and the resistive element 19 exceeds the threshold value is referred to as an overcurrent state.

Figure 12:
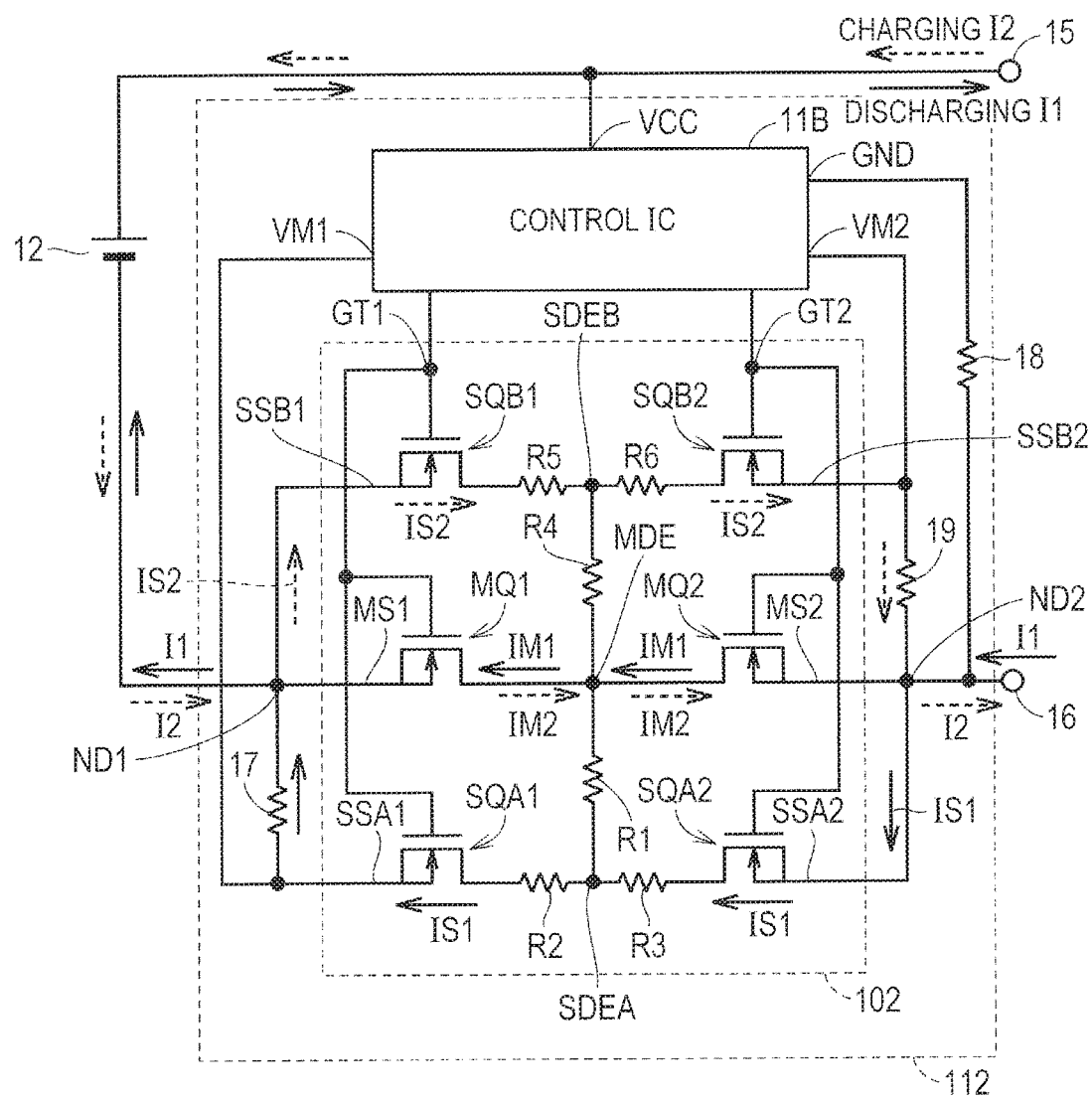
FIG. 12 is a diagram for showing the current direction at the time of discharging of a rechargeable battery and the current direction at the time of charging in the overcurrent protection device of FIG. 11.

FIG. 12 is a diagram for showing the current direction at the time of discharging of the rechargeable battery and the current direction at the time of charging in the overcurrent protection device of FIG. 11. In FIG. 12, the current direction at the time of discharging is indicated by a solid-line arrow, and the current direction at the time of charging is indicated by a broken-line arrow. Hereinafter, the operations of the overcurrent protection device 112 at the time of discharging and at the time of charging will be separately described with reference to FIG. 12.

(1. Operation at the Time of Discharging of Rechargeable Battery)

In the case of the normal state, both the main MOS transistors MQ1 and MQ2 are in the on-state and all of the sense MOS transistors SQA1, SQA2, SQB1, and SQB2 are in the on-state in accordance with the control signals output from the control IC11 to the gate terminals GT1 and GT2, respectively.

A discharging current I1 flows from the positive electrode of the rechargeable battery 12 towards the power supply node 15, and flows from the power supply node 16 towards the negative electrode of the rechargeable battery 12. With respect to the semiconductor device 102 coupled between the power supply node 16 and the negative electrode of the rechargeable battery 12, the discharging current I1 flows from the node ND2 towards the node ND1.

More specifically, the discharging current I1 flowing into the node ND2 is divided into a main current IM1 and a sense current IS1 at the node ND2. Due to the presence of the resistive element 19, the sense current IS1 hardly flows towards the sense MOS transistor SQB2 through the resistive element 19, but flows towards the sense MOS transistor SQA2. The division ratio between the main current IM1 and the sense current IS1 is roughly determined on the basis of the area ratio between the formation region of the source diffusion layer of the main MOS transistor MQ2 and the formation region of the source diffusion layer of the sense MOS transistor SQA2.

The main current IM1 flows in the channel region from the source electrode MS2 of the main MOS transistor MQ2 towards the drain electrode MDE, and further flows in the channel region from the drain electrode MDE of the main MOS transistor MQ1 towards the source electrode MS1. In this case, the main current IM1 also flows in the parasitic diode of the main MOS transistor MQ2, but does not flow in the parasitic diode of the main MOS transistor MQ1 due to the opposite direction. The main current IM1 having passed through the main MOS transistor MQ1 reaches the node ND1.

On the other hand, the sense current IS1 flows in the channel region from the source electrode SSA2 of the sense MOS transistor SQA2 towards the drain electrode SDEA, and further flows in the channel region from the drain electrode SDEA of the sense MOS transistor SQA1 towards the source electrode SSA1. In this case, the sense current IS1 also flows in the parasitic diode of the sense MOS transistor SQA2, but does not flow in the parasitic diode of the sense MOS transistor SQA1 due to the opposite direction.

The sense current IS1 having passed through the sense MOS transistor SQA1 further passes through the resistive element 17, and reaches the node ND1. At the node ND1, the main current IM1 and the sense current IS1 join together. It should be noted that since the resistance value of the resistive element 17 is formed to be about ⅒ of the resistance value of the parasitic resistor R1, the sense current IS1 hardly flows in the parasitic resistor R1.

The control IC11 detects the voltage (the potential of the source electrode SSA1 of the sense MOS transistor SQA1 in the case of FIG. 12) generated in the resistive element 17 by the sense current IS1 and the voltage (the potential of the source electrode SSB2 of the sense MOS transistor SQB2 in the case of FIG. 12) generated in the resistive element 19. Since the sense current IS1 hardly flows in the resistive element 19 at the time of discharging, the voltage generated in the resistive element 19 does not exceed a preset threshold value. On the other hand, in the case where the discharging current I1 becomes overcurrent, the voltage generated in the resistive element 17 by the sense current IS1 exceeds the preset threshold value. In this case, the control IC11 outputs to the gate terminal GT1 the control signal for setting the main MOS transistor MQ1 to be in the off-state. Accordingly, the sense MOS transistors SQA1 and SQB1 are also set to be in the off-state, and thus the discharging current I1 is blocked by the semiconductor device 102.

(2. Operation of Rechargeable Battery at the Time of Charging)

In the case of the normal state, both the main MOS transistors MQ1 and MQ2 are in the on-state and all of the sense MOS transistors SQA1, SQA2, SQB1, and SQB2 are in the on-state in accordance with the control signal output from the control IC11 to each of the gate terminals GT1 and GT2.

A charging current I2 flows from the power supply node 15 towards the positive electrode of the rechargeable battery 12, and flows from the negative electrode of the rechargeable battery 12 towards the power supply node 16. With respect to the semiconductor device 102 coupled between the power supply node 16 and the negative electrode of the rechargeable battery 12, the charging current I2 flows from the node ND1 towards the node ND2.

More specifically, the charging current I2 flowing into the node ND1 is divided into a main current IM2 and a sense current IS2 at the node ND1. Due to the presence of the resistive element 17, the sense current IS2 hardly flows towards the sense MOS transistor SQA1 through the resistive element 17, but flows towards the sense MOS transistor SQB1. The division ratio between the main current IM2 and the sense current IS2 is roughly determined on the basis of the area ratio between the formation region of the source diffusion layer of the main MOS transistor MQ1 and the formation region of the source diffusion layer of the sense MOS transistor SQB1.

The main current IM2 flows in the channel region from the source electrode MS1 of the main MOS transistor MQ1 towards the drain electrode MDE, and further flows in the channel region from the drain electrode MDE of the main MOS transistor MQ2 towards the source electrode MS2. In this case, the main current IM2 also flows in the parasitic diode of the main MOS transistor MQ1, but does not flow in the parasitic diode of the main MOS transistor MQ2 due to the opposite direction. The main current IM2 having passed through the main MOS transistor MQ2 reaches the node ND2.

On the other hand, the sense current IS2 flows in the channel region from the source electrode SSB1 of the sense MOS transistor SQB1 towards the drain electrode SDEB, and flows in the channel region from the drain electrode SDEB of the sense MOS transistor SQB2 towards the source electrode SSB2. In this case, the sense current IS2 also flows in the parasitic diode of the sense MOS transistor SQB1, but does not flow in the parasitic diode of the sense MOS transistor SQB2 due to the opposite direction.

The sense current IS2 having passed through the sense MOS transistor SQB2 further passes through the resistive element 19, and reaches the node ND2. At the node ND2, the sense current IS2 and the main current IM2 join together. It should be noted that since the resistance value of the resistive element 19 is formed to be about 1/10 of the resistance value of the parasitic resistor R4, the sense current IS2 hardly flows in the parasitic resistor R4.

The control IC11 detects the voltage (the potential of the source electrode SSA1 of the sense MOS transistor SQA1 in the case of FIG. 12) generated in the resistive element 17 by the sense current IS2 and the voltage (the potential of the source electrode SSB2 of the sense MOS transistor SQB2 in the case of FIG. 12) generated in the resistive element 19. Since the sense current IS2 hardly flows in the resistive element 17 at the time of charging, the voltage generated in the resistive element 17 does not exceed a preset threshold value. On the other hand, in the case where the charging current I2 becomes overcurrent, the voltage generated in the resistive element 19 by the sense current IS2 exceeds the preset threshold value. In this case, the control IC11 outputs to the gate terminal GT2 the control signal for setting the main MOS transistor MQ2 to be in the off-state. Accordingly, the sense MOS transistors SQA2 and SQB2 are also set to be in the off-state, and thus the charging current I2 is blocked by the semiconductor device 102.

[Concrete Structure of Semiconductor Device]

Figure 13:
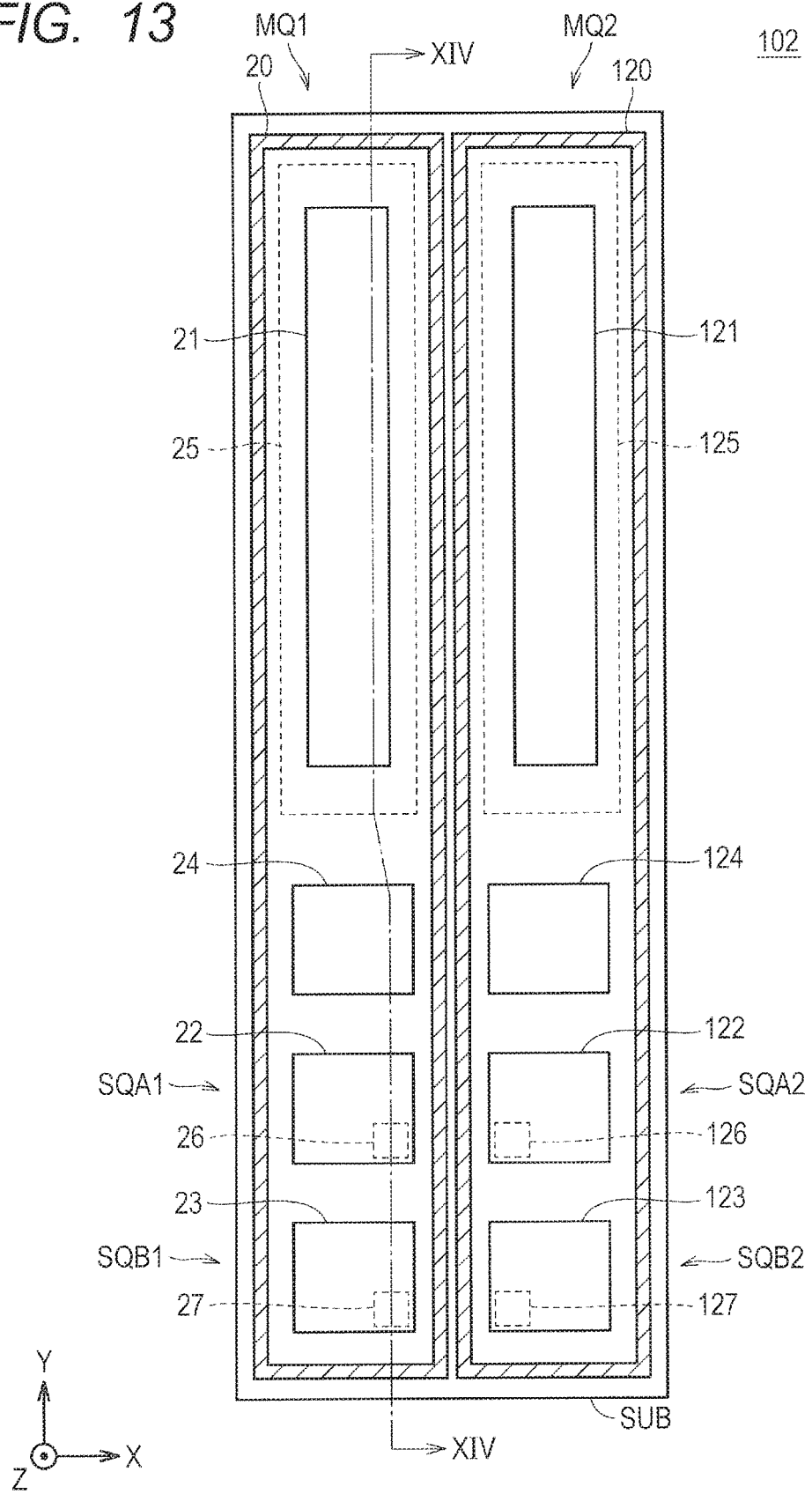
FIG. 13 is a plan view of the semiconductor device corresponding to the equivalent circuit of FIG. 11.
Figure 14:
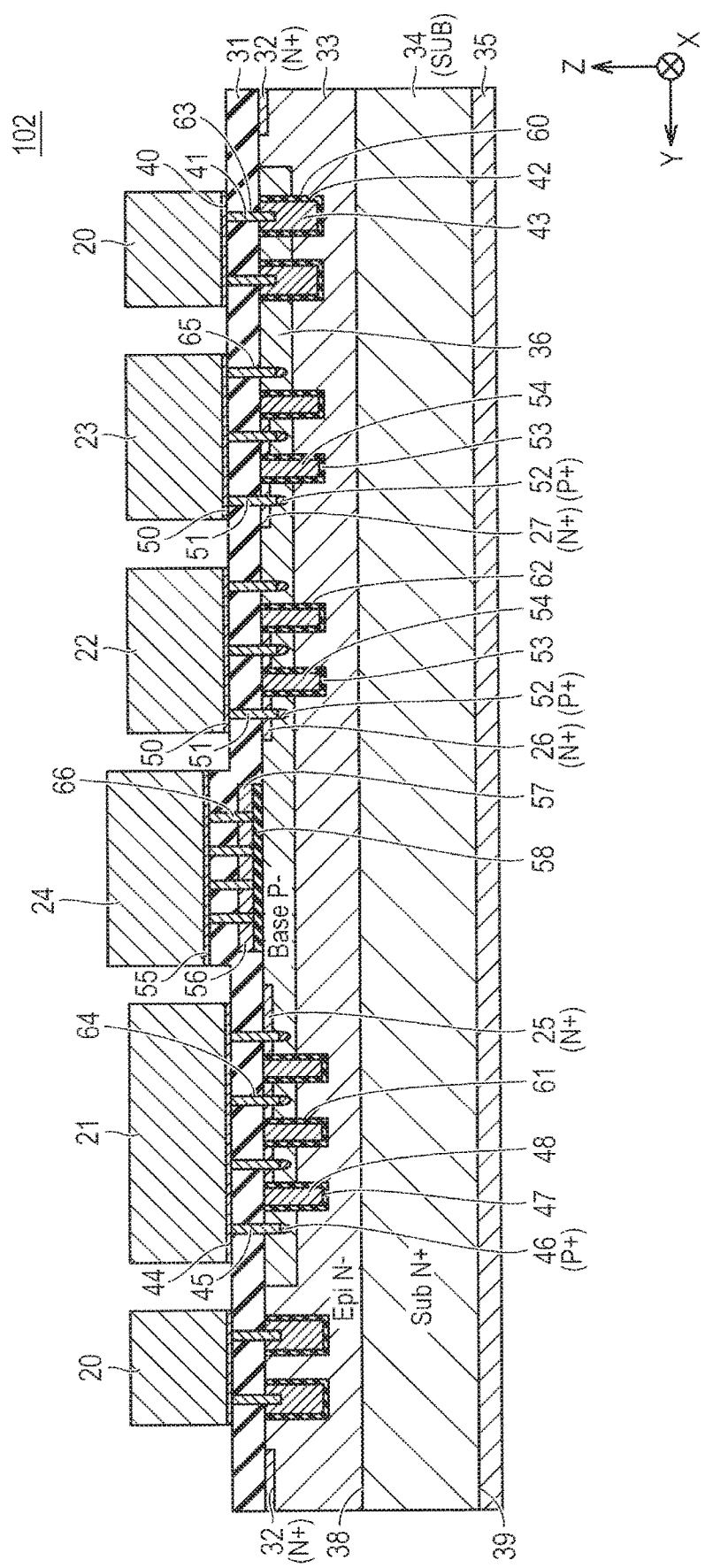
FIG. 14 is a diagram for schematically showing a cross-sectional structure taken along the line XIV-XIV of FIG. 13.

FIG. 13 is a plan view of the semiconductor device corresponding to the equivalent circuit of FIG. 11. FIG. 14 is a diagram for schematically showing a cross-sectional structure taken along the line XIV-XIV of FIG. 13. The sense MOS transistors SQA1 and SQA2 of FIG. 13 and FIG. 14 correspond to the sense MOS transistors SQ1 and SQ2 of FIG. 9 and FIG. 10. In the case of FIG. 13 and FIG. 14, the sense MOS transistors SQB1 and SQB2 are further provided.

With reference to FIG. 13, the formation region of a source diffusion layer 27 of the sense MOS transistor SQB1 and the formation region of a source diffusion layer 127 of the sense MOS transistor SQB2 are arranged side by side in the X direction when viewed from the vertical direction of the substrate SUB. A sense pad 23 of the sense MOS transistor SQB1 and a sense pad 123 of the sense MOS transistor SQB2 are arranged side by side in the X direction. The sense pad 23 is arranged on the opposite side of a gate pad 24 with respect to a sense pad 22. The sense pad 123 is arranged on the opposite side of a gate pad 124 with respect to a sense pad 122. The sense pad 23 corresponds to the source electrode SSB1 of FIG. 11, and the sense pad 123 corresponds to the source electrode SSB2 of FIG. 11.

Since the other points in FIG. 13 are the same as those in FIG. 9, the same or corresponding parts are followed by the same reference numerals, and the explanation thereof will not be repeated. For example, the ratio L1/W1 of the shortest distance L1 between a source diffusion layer 26 and a source diffusion layer 125 and the shortest distance L1 between a source diffusion layer 25 and a source diffusion layer 126 to the shortest distance W1 between the source diffusion layer 26 and the source diffusion layer 126 needs to be set to 3 or larger. Likewise, the ratio L2/W2 of the shortest distance L2 between the source diffusion layer 27 and the source diffusion layer 125 and the shortest distance L2 between the source diffusion layer 25 and the source diffusion layer 127 to the shortest distance W2 between the source diffusion layer 27 and the source diffusion layer 127 needs to be set to 3 or larger.

The cross-sectional view of FIG. 14 is different from the cross-sectional view of FIG. 10 in that a cross-sectional structure near the sense pad 23 is added. As shown in FIG. 14, the sense pad 23 is formed on an interlayer insulating layer 31 with a barrier metal film 50 interposed therebetween. A plurality of trench gates 54 penetrating an N+ source diffusion layer 27 and a P− base diffusion layer 36 to reach the inside of an N− drift layer 33 is formed under the sense pad 23. Further, a contact 51 penetrating the interlayer insulating layer 31 and the N+ source diffusion layer 27 to reach the inside of the P− base diffusion layer 36 or penetrating the interlayer insulating layer 31 to reach the inside of the P− base diffusion layer 36 is formed under the sense pad 23. A P+ contact region 52 is formed at the tip of the contact 51. The sense pad 23 is coupled to the N+ source diffusion layer 27 and the P− base diffusion layer 36 through the contact 51.

Since the other parts in FIG. 14 are the same as those in FIG. 10, the same or corresponding parts are followed by the same reference numerals, and the explanation thereof will not be repeated.

Effect of Third Embodiment

In the semiconductor device 102 of the third embodiment, as described in FIG. 11 and FIG. 12, the main MOS transistors MQ1 and MQ2 are inversely coupled to each other in series between the node ND1 and the node ND2, and the sense MOS transistors SQA1 and SQA2 are inversely coupled to each other in series. Further, the sense MOS transistors SQB1 and SQB2 are inversely coupled to each other in series. The main MOS transistors MQ1 and MQ2 and the sense MOS transistors SQA1, SQA2, SQB1, and SQB2 have a common drain electrode on the back surface of the substrate.

Further, the resistive element 17 is coupled between the node ND1 and the source electrode SSA1 of the sense MOS transistor SQA1 in order to detect the sense current flowing in the sense MOS transistors SQA1 and SQA2. The resistive element 19 is coupled between the node ND2 and the source electrode SSB2 of the sense MOS transistor SQB2 in order to detect the sense current flowing in the sense MOS transistors SQB1 and SQB2.

According to the above-described configuration, whether or not the current (the charging current I2 in the case of FIG. 12) flowing from the node ND1 towards the node ND2 has become overcurrent can be detected on the basis of whether or not the voltage generated in the resistive element 19 has exceeded the threshold value. Likewise, whether or not the current (the discharging current I1 in the case of FIG. 12) flowing from the node ND2 towards the node ND1 has become overcurrent can be detected on the basis of whether or not the voltage generated in the resistive element 17 has exceeded the threshold value.

As described above, it is possible to distinguish the direction of the current that has become overcurrent on the basis of whether or not the voltage generated in any one of the resistive element 17 and the resistive element 19 has exceeded the threshold value. Therefore, in the case where the current generated in the resistive element 19 has become overcurrent, the current flowing in the semiconductor device 102 can be blocked by outputting to the gate terminal GT2 the control signal for immediately setting the main MOS transistor MQ2 and the sense MOS transistors SQA2 and SQB2 to be in the off-state without separately obtaining information on the current direction. On the contrary, in the case where the current generated in the resistive element 17 has become overcurrent, the current flowing in the semiconductor device 102 can be blocked by outputting to the gate terminal GT1 the control signal for immediately setting the main MOS transistor MQ1 and the sense MOS transistors SQA1 and SQB1 to be in the off-state.

Since the other effects of the third embodiment are the same as those of the first and second embodiments, the explanation thereof will not be repeated.

Fourth Embodiment

A semiconductor device 103 of a fourth embodiment is obtained by modifying the semiconductor device 100 of the first embodiment. Specifically, in the semiconductor device 103, metal drain electrodes 35 are separated from each other and N+ drain layers 34 are separated from each other on the side where main MOS transistors MQ1 and MQ2 are located and on the side where sense MOS transistors SQ1 and SQ2 are located. Hereinafter, the fourth embodiment will be described in detail with reference to the drawings.

Figure 15:
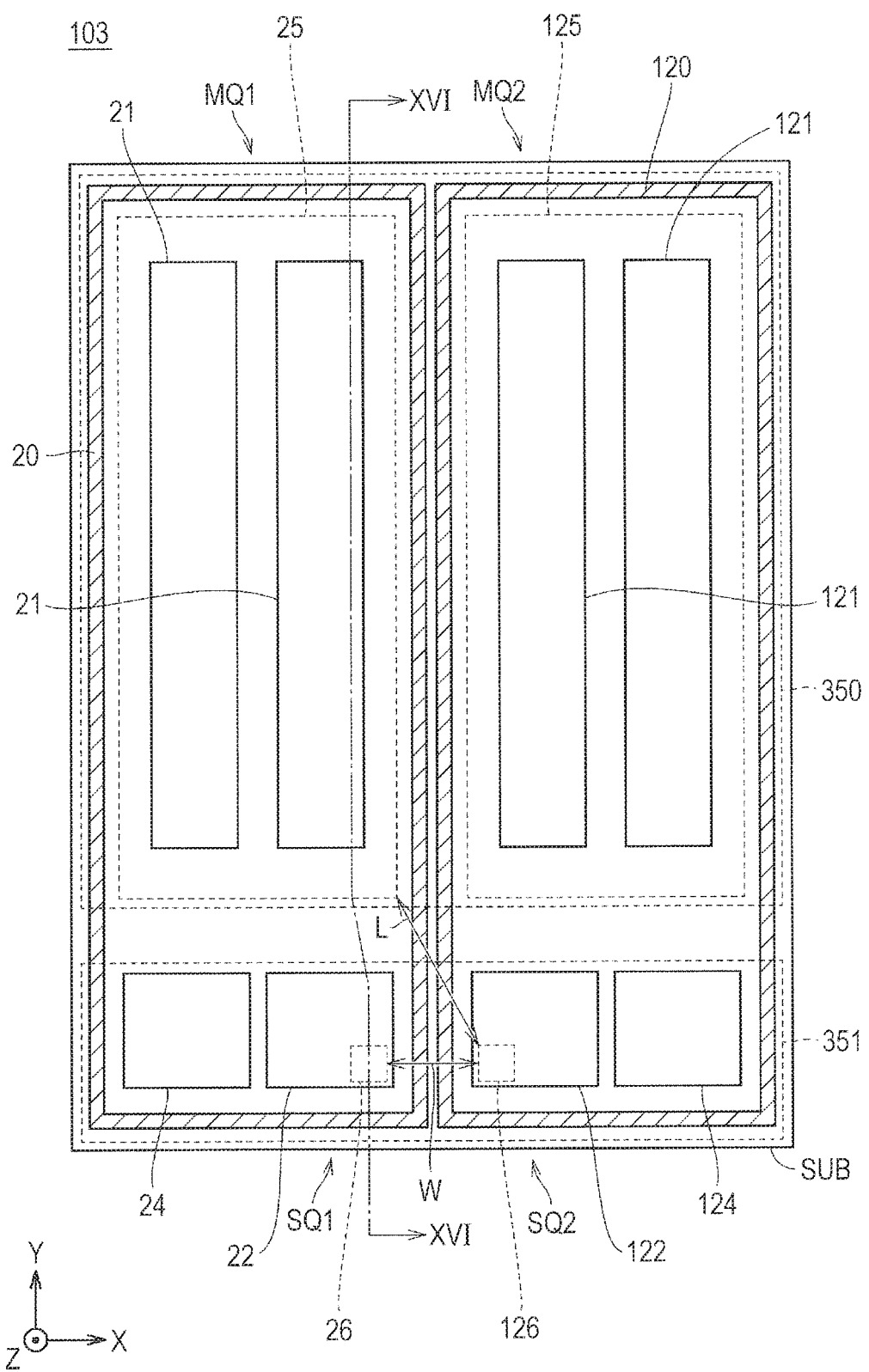
FIG. 15 is a plan view for schematically showing an example of a concrete structure of a semiconductor device according to a fourth embodiment.
Figure 16:
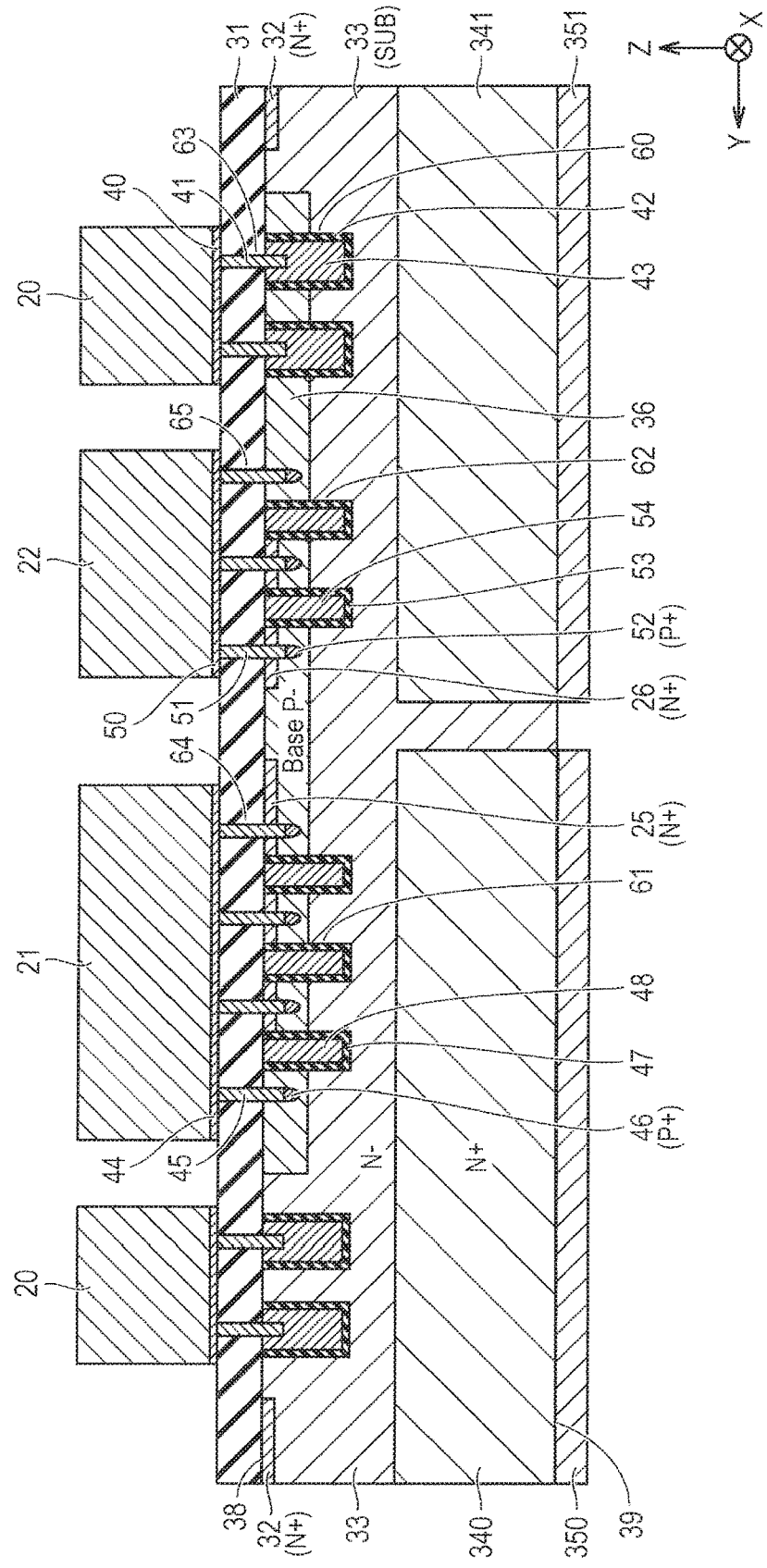
FIG. 16 is a diagram for schematically showing a cross-sectional structure taken along the line XVI-XVI of FIG. 15.

FIG. 15 is a plan view for schematically showing an example of a concrete structure of a semiconductor device according to the fourth embodiment. FIG. 16 is a diagram for schematically showing a cross-sectional structure taken along the line XVI-XVI of FIG. 15. The equivalent circuit of the semiconductor device 103 in FIG. 15 and FIG. 16 is the same as the equivalent circuit of the semiconductor device 100 shown in FIG. 1 and FIG. 2. However, the resistance value of a parasitic resistor R1 can be made larger than that in the case of the first embodiment.

With reference to FIG. 15 and FIG. 16, the semiconductor device 103 includes a metal drain electrode 350 shared by the main MOS transistors MQ1 and MQ2 and a metal drain electrode 351 shared by the sense MOS transistors SQ1 and SQ2. The metal drain electrodes 350 and 351 are separated from each other. The metal drain electrode 350 corresponds to the drain electrode MDE of FIG. 1 and FIG. 2, and the metal drain electrode 351 corresponds to the drain electrode SDE of FIG. 1 and FIG. 2.

Further, as shown in FIG. 15 and FIG. 16, the semiconductor device 103 includes an N+ drain layer 340 shared by the main MOS transistors MQ1 and MQ2 and an N+ drain layer 341 shared by the sense MOS transistors SQ1 and SQ2. The N+ drain layers 340 and 341 may also be separated from each other.

In the case where the semiconductor device 103 configured as shown in FIG. 15 and FIG. 16 is manufactured, an N− semiconductor substrate corresponding to the N− drift layer 33 is used in place of the N+ semiconductor substrate corresponding to the N+ drain layer 34. On the back surface of the N− semiconductor substrate, N+ drain layers 340 and 341 are formed by ion implantation (further, by thermal diffusion as necessary) using a resist or the like as a mask. Further, a thick metal film is formed on the N+ drain layers 340 and 341. The metal drain electrodes 350 and 351 are formed by separating the thick metal film using lithography and etching.

In the case of the semiconductor device 103 having the above-described structure, the parasitic resistor R1 of FIG. 2 can be sufficiently increased. Therefore, even if the shortest distance L between a source diffusion layer 26 and a source diffusion layer 125 and the shortest distance L between a source diffusion layer 25 and a source diffusion layer 126 are the same as compared to the shortest distance W between the source diffusion layer 26 and the source diffusion layer 126, the sense current through the parasitic resistor between the sense MOSFET and the main MOSFET can be prevented from flowing.

The invention achieved by the inventors has been described above in detail on the basis of the embodiments. However, it is obvious that the present invention is not limited to the above-described embodiments, and can be variously changed without departing from the scope thereof.

What is claimed is:

1. A semiconductor device comprising:
    a substrate;
    a first main MOSFET (Metal Oxide Semiconductor Field Effect Transistor) that includes a first source electrode formed on the main surface side of the substrate and a first drain electrode formed on the back surface side of the substrate;
    a second main MOSFET that has a second source electrode formed on the main surface side of the substrate and shares the first drain electrode with the first main MOSFET;
    a first sense MOSFET that includes a first sense electrode formed on the main surface side of the substrate and a second drain electrode formed on the back surface side of the substrate and detects a main current flowing in the first main MOSFET;
    a second sense MOSFET that has a second sense electrode formed on the main surface side of the substrate, shares the second drain electrode with the first sense MOSFET, and detects a main current flowing in the second main MOSFET;
    a first gate pad that is electrically coupled to a gate electrode of the first main MOSFET and a gate electrode of the first sense MOSFET and is formed on the main surface side of the substrate, and
    a second gate pad that is electrically coupled to a gate electrode of the second main MOSFET and a gate electrode of the second sense MOSFET and is formed on the main surface side of the substrate.

2. The semiconductor device according to claim 1,
    wherein the first drain electrode and the second drain electrode are configured using a common metal layer, and
    wherein each of the shortest distance between a source diffusion layer of the first sense MOSFET and a source diffusion layer of the second main MOSFET and the shortest distance between a source diffusion layer of the second sense MOSFET and a source diffusion layer of the first main MOSFET is at least three times the shortest distance between the source diffusion layer of the first sense MOSFET and the source diffusion layer of the second sense MOSFET.

3. The semiconductor device according to claim 1,
wherein the first drain electrode and the second drain electrode are separated from each other.

4. The semiconductor device according to claim 3,
wherein the first main MOSFET and the second main MOSFET share a first drain layer that is an impurity semiconductor layer adjacent to the first drain electrode, and
wherein the second sense MOSFET and the second sense MOSFET share a second drain layer that is an impurity semiconductor layer adjacent to the second drain electrode and separated from the first drain layer.

5. The semiconductor device according to claim 1,
wherein the first source electrode and the second source electrode are arranged side by side along a first direction when viewing the substrate in planar view, and
wherein the first gate pad, the first sense electrode, the second sense electrode, and the second gate pad are arranged side by side in this order along the first direction when viewing the substrate in planar view.

6. The semiconductor device according to claim 1,
wherein the first source electrode and the second source electrode are arranged side by side along a first direction when viewing the substrate in planar view,
wherein the first sense electrode and the second sense electrode are arranged side by side along the first direction when viewing the substrate in planar view,
wherein the first gate pad is arranged between the first source electrode and the first sense electrode when viewing the substrate in planar view, and
wherein the second gate pad is arranged between the second source electrode and the second sense electrode when viewing the substrate in planar view.

7. The semiconductor device according to claim 1, further comprising:
a third sense MOSFET that has a third sense electrode formed on the main surface side of the substrate, shares the second drain electrode with the first and second sense MOSFETs, and detects a main current flowing in the first main MOSFET; and
a fourth sense MOSFET that has a fourth sense electrode formed on the main surface side of the substrate, shares the second drain electrode with the first and second sense MOSFETs, and detects a main current flowing in the second main MOSFET,
wherein the first gate pad is further electrically coupled to a gate electrode of the third sense MOSFET, and
wherein the second gate pad is further electrically coupled to a gate electrode of the fourth sense MOSFET.

8. The semiconductor device according to claim 7,
wherein the first drain electrode and the second drain electrode are configured using a common metal layer,
wherein each of the shortest distance between a source diffusion layer of the first sense MOSFET and a source diffusion layer of the second main MOSFET and the shortest distance between a source diffusion layer of the second sense MOSFET and a source diffusion layer of the first main MOSFET is at least three times the shortest distance between the source diffusion layer of the first sense MOSFET and the source diffusion layer of the second sense MOSFET, and
wherein each of the shortest distance between a source diffusion layer of the third sense MOSFET and the source diffusion layer of the second main MOSFET and the shortest distance between a source diffusion layer of the fourth sense MOSFET and the source diffusion layer of the first main MOSFET is at least three times the shortest distance between the source diffusion layer of the third sense MOSFET and the source diffusion layer of the fourth sense MOSFET.

9. The semiconductor device according to claim 1,
wherein the thickness of the first drain electrode is 3 µm or larger.

10. An overcurrent protection device,
wherein an overcurrent detection device comprises:
a first node;
a second node; and
a semiconductor device,
wherein the semiconductor device includes:
a substrate;
a first main MOSFET that includes a first source electrode formed on the main surface side of the substrate and a first drain electrode formed on the back surface side of the substrate;
a second main MOSFET that has a second source electrode formed on the main surface side of the substrate and shares the first drain electrode with the first main MOSFET;
a first sense MOSFET that includes a first sense electrode formed on the main surface side of the substrate and a second drain electrode formed on the back surface side of the substrate and detects a main current flowing in the first main MOSFET;
a second sense MOSFET that has a second sense electrode formed on the main surface side of the substrate, shares the second drain electrode with the first sense MOSFET, and detects a main current flowing in the second main MOSFET;
a first gate pad that is electrically coupled to a gate electrode of the first main MOSFET and a gate electrode of the first sense MOSFET and is formed on the main surface side of the substrate; and
a second gate pad that is electrically coupled to a gate electrode of the second main MOSFET and a gate electrode of the second sense MOSFET and is formed on the main surface side of the substrate,
wherein the first source electrode is coupled to the first node,
wherein the second source electrode is coupled to the second node,
wherein the second sense electrode is coupled to the second source electrode, and
wherein the overcurrent detection device further comprises a first shunt resistor coupled between the first source electrode and the first sense electrode and a control circuit that outputs a first control signal to the first gate pad and outputs a second control signal to the second gate pad are further provided.

11. The overcurrent protection device according to claim 10,
wherein the control circuit is configured to output the second control signal to turn off the second main MOSFET in the case where a current flows from the first node towards the second node and in the case where a voltage generated in the first shunt resistor exceeds a threshold value, and to output the first control signal to turn off the first main MOSFET in the case where a current flows from the second node towards the first node and in the case where the voltage generated in the first shunt resistor exceeds the threshold value.

12. The overcurrent protection device according to claim 10, wherein the semiconductor device further includes:
a third sense MOSFET that has a third sense electrode formed on the main surface side of the substrate, shares the second drain electrode with the first and second sense MOSFETs, and detects a main current flowing in the first main MOSFET; and a fourth sense MOSFET that has a fourth sense electrode formed on the main surface side of the substrate, shares the second drain electrode with the first and second sense MOSFETs, and detects a main current flowing in the second main MOSFET, wherein the first gate pad is further electrically coupled to a gate electrode of the third sense MOSFET, wherein the second gate pad is further electrically coupled to a gate electrode of the fourth sense MOSFET, wherein the third sense electrode is coupled to the first source electrode, and wherein the overcurrent detection device further comprises a second shunt resistor coupled between the second source electrode and the fourth sense electrode is further provided.

13. The overcurrent protection device according to claim 12, wherein the control circuit is configured to output the first control signal to turn off the first main MOSFET in the case where a voltage generated in the first shunt resistor exceeds a threshold value, and to output the second control signal to turn off the second main MOSFET in the case where a voltage generated in the second shunt resistor exceeds the threshold value.

* * * * *